US009546100B2

(12) United States Patent
Blatchley, III et al.

(10) Patent No.: US 9,546,100 B2
(45) Date of Patent: Jan. 17, 2017

(54) CONTINUOUS-FLOW SOLAR ULTRAVIOLET DISINFECTION SYSTEM FOR DRINKING WATER

(75) Inventors: Ernest R Blatchley, III, West Lafayette, IN (US); Eric Gentil Mbonimpa, Las Vegas, NV (US); Bruce Applegate, West Lafayette, IN (US); Bryan Vadheim, Miles City, MT (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 14/342,080

(22) PCT Filed: Aug. 29, 2012

(86) PCT No.: PCT/US2012/052767
§ 371 (c)(1),
(2), (4) Date: Feb. 28, 2014

(87) PCT Pub. No.: WO2013/033144
PCT Pub. Date: Mar. 7, 2013

(65) Prior Publication Data
US 2014/0225002 A1    Aug. 14, 2014

Related U.S. Application Data

(60) Provisional application No. 61/528,551, filed on Aug. 29, 2011.

(51) Int. Cl.
*G01N 23/10* (2006.01)
*C02F 1/32* (2006.01)
(Continued)

(52) U.S. Cl.
CPC ............... *C02F 1/32* (2013.01); *C02F 1/325* (2013.01); *G06F 17/5009* (2013.01);
(Continued)

(58) Field of Classification Search
CPC ............................ A61L 2/0029; A61L 2/0047
(Continued)

(56) References Cited

U.S. PATENT DOCUMENTS 4,340,034 A * 7/1982 Hopper ............... F24J 2/07
126/659
4,504,362 A * 3/1985 Kruse ..................... 203/3
(Continued)

OTHER PUBLICATIONS

Rodriguez et al., Solar Water Disinfection Studies with Supported TiO2 and Polymer-Supported Ru(II) Sensitizer in a Compound Parabolic Collector, Nov. 9, 2009, J. Sol. Energy Eng. 132(1), Abstract.*
(Continued)

*Primary Examiner* — Wyatt Stoffa
*Assistant Examiner* — Jason McCormack
(74) *Attorney, Agent, or Firm* — Hartman Global IP Law; Gary M. Hartman; Domenica N. S. Hartman

(57) ABSTRACT

Potable drinking water is a scarce resource in many parts of developing countries, especially rural areas. Due to limited financial means of these countries, low cost point-of-use systems are thought to be appropriate technology to treat water. Systems using solar ultraviolet (UV) radiation could be successful since many vulnerable countries are located where solar radiation is intense and abundant throughout the year. The goal of this disclosure is to develop a simple and low cost point-of-use solar UV reactor to disinfect water. In this disclosure wavelength-dependent microbial dose-response behavior was investigated using surrogates to pathogenic microbes. A solar radiation prediction method based on the SMARTS model was used to predict solar UV intensity as function of geographic location and time. A numerical modeling procedure using the discrete ordinate (DO) model and CFD software (FLUENT) was used to simulate UV dose (distribution) delivery to microorganisms.

(Continued)

Then, the dose distribution was combined with the dose response behavior using a segregated flow model to predict microbial inactivation by the reactor. A prototype was produced and tested to validate the numerical modeling procedure. The inactivation results from the prototype were in agreement with numerical inactivation prediction. The modeling procedure permits parameters such as reactor dimensions and material properties to be varied to meet a treatment goal.

10 Claims, 20 Drawing Sheets

(51) Int. Cl.
  *G06F 17/50* (2006.01)
  *C02F 1/00* (2006.01)
(52) U.S. Cl.
  CPC .......... *C02F 1/008* (2013.01); *C02F 2303/04* (2013.01); *Y02W 10/37* (2015.05)
(58) Field of Classification Search
  USPC .................. 250/428, 430, 431, 432 R, 436, 453.11, 250/454.11, 455.11
  See application file for complete search history.

(56) References Cited

U.S. PATENT DOCUMENTS

| | | | | |
|---|---|---|---|---|
| 4,678,292 | A * | 7/1987 | Miyatani | F21V 7/16 126/570 |
| 5,803,139 | A * | 9/1998 | Kennedy | 141/231 |
| 2001/0048891 | A1* | 12/2001 | McGeorge | A61L 2/10 422/22 |
| 2007/0108056 | A1* | 5/2007 | Nyberg et al. | 204/554 |
| 2008/0047546 | A1* | 2/2008 | Cummings | 126/684 |
| 2008/0248257 | A1* | 10/2008 | Zanchetta et al. | 428/172 |
| 2009/0199892 | A1* | 8/2009 | Farquhar | 136/248 |
| 2009/0269240 | A1* | 10/2009 | Tanaka | 422/24 |
| 2010/0276645 | A1* | 11/2010 | Aspin | C09J 9/02 252/513 |
| 2011/0026474 | A1* | 2/2011 | Freda | H04K 1/10 370/329 |
| 2012/0011851 | A1* | 1/2012 | Lievre | F24J 2/085 60/641.15 |

OTHER PUBLICATIONS

Orfan, The Solar Kangaroo, pp. 1-8, Accessed at <http://h2ohow.com_articles_Solar-Kangaroo-120910.pdf>.*
Plataforma Solar de America Annual Report 2001, pp. 1-80, Accessed at <www.pas.es_webeng_techrep_2001_atr2001eng.pdf>.*
Orfan, The Solar Kangaroo, pp. 1-8, Accessed at <http://h20how.com_articles_Solar-Kangaroo-120910.pdf>.*
Platforma Solar de America Annual Report 2001, pp. 1-80, Accessed at <www.pass.es_webeng_techrep_2001_atr2001eng.pdf>.*
Blanco et al., Compound Parabolic Concentrator Technology Development to Commercial Solar Detoxification Applications, 1999, Solar Energy vol. 67, Nos. 4-6, pp. 317-330.*
Gill et al., Solar Disinfection Kinetic Design Parameters for Continuous Flow Reactors, 2007,Journal of Solar Energy Engineering, vol. 129, pp. 111-118.*
McMurray et al., Photocatalytic and ELectrochemically Assisted Photocatalytic Oxidation of Formic Acid on TiO2 Films Under UVA and UVB Irradiation, 2005, Journal of Applied Electrochemistry, 35, 723-731.*
Rodriguez et al., Solar Water Disinfection Studies with Supported TiO2 and Polymer-Supported Ru(II) Sensitizer in a Compound Parabolic Collector, Nov. 9, 2009, J. Sol. Energy Eng. 132(1), Abstract.*
Hass et al., OPtical Constants and Reflectance and Transmittance of Evaporated Aluminum in the Visible and Ultraviolet, Feb. 13, 1961, Journal of the Optical Society of America, vol. 51, No. 7, pp. 719-722.*
McMurray et al., Photocatalytic and Electrochemically Assisted Photocatalytic Oxidation of Formic Acid on TiO2 Films under UVA and UVB irradiation, 2005, Journal of Applied Electrochemistry, 35, 723-731.*
Rodriguez et al., Solar Water Disinfection Studies with Supported TiO2 and Polymer-Supported Ru(II) Sensitizer in a Compound Parabolic Collector, Nov. 9, 2009, J. Sol. Eng. 132(1), Abstract.*
Hass et al., Optical Contants and Reflectance and Transmittance of Evaporated Aluminum in the Visible and Ultraviolet, Feb. 13, 1961, Journal of the Optical Society of America, vol. 51, No. 7, pp. 719-722.*
Bandala et al., Solar Photoreactors Comparison Based on Oxalic Acid Photocatalytic Degredation, May 4, 2004, Solar Energy, 77, pp. 503-512.*
Platforma Solar de America Annual Report 2001, pp. 1-80, Accessed at <www.pass.es_webang_techrep_2001_atr2001eng.pdf>.*
Blanco et al., Compound Parabolic Concentrator Technology Development to Commercial Solar Detoxifcation Applications, 1999, Solar Energy vol. 67, Nos. 4-6, pp. 317-330.*
Gill et al., Solar Disinfection Kinetic Design Parameters for Continuous Flow Reactors, 2007, Journal of Solar Energy Engineering, vol. 129, pp. 111-118.*
Meierhofer et al., Solar Water Disinfection a Guide for the Application of SODI, Oct. 2002, Swiss Federal Institute of Environmental Science and Technology, Department of Water and Sanitation in Developing COuntries, SANDEC Report No. 06/02.*
Azar, C., et al., Are the economic costs of stabilising the atmosphere prohibitive? Ecological Economics 42 (2002) 73-80.
Berney, M., et al., Efficacy of solar disinfection of *Escherichia coli*, *Shigella flexneri*, *Salmonella typhimurium* and *Vibrio cholerae*. Journal of Applied Microbiology, October 1-9, 2006.
Blatchley III, E. R., et al., Bacterial responses to ultraviolet irradiation. Water Science and Technology vol. 43 No. 10, pp. 179-186 (2001).
Blatchley III, E. R., et al., Numerical Modelling of UV Intensity: Application to Collimated-Beam Reactors and Continuous-Flow Systems. War. Res. vol. 31, No. 9, pp. 2205-2218 (1997).
Caldwell, J. C., The Control of Family Size in Tropical Africa. Demography, vol. 5, No. 2, Progress and Problems of Fertility Control around the World (1968), pp. 598-619.
Dejung, S. et al., Effect of solar water disinfection (SODIS) on model microorganisms under improved and field SODIS conditions. Journal of Water Supply: Research and Technology—AQUA, pp. 245-256 (2007).
Durst, F., et al., Low Reynolds numbers flow over a plane symmetric sudden expansion. J . Fluid Me&. (1974), vol. 64, part 1, pp. 111-128.
Fallon, K. S., et al., Development and characterization of nonpathogenic surrogates for UV reactor validation. Journal (American Water Works Association), vol. 99, No. 3 (Mar. 2007), pp. 73-82.
Gadgil, A., Drinking Water in Developing Countries. Annu. Rev. Energy Environ. 1998. 23:253-86.
Giese, N., et al., Sensitivity of Microorganisms to Different Wavelengths of UV Light: Implications on Modeling of Medium Pressure UV Systems. Wat. Res. vol. 34, No. 16, pp. 4007-4013, 2000.
Gill, L. W. et al., Solar Disinfection Kinetic Design Parameters for Continuous Flow Reactors. Journal of Solar Energy Engineering, Feb. 2007, vol. 129 / 111-118.
Hu, J., et al., Effects of UV Radiation on Photolyase and Implications with Regards to Photoreactivation following Low- and Medium-Pressure UV Disinfection. Applied and Evironmental Microbiology, Jan. 2008, p. 327-328.
Harris, G. D., et al., Ultraviolet Inactivation of Selected Bacteria and Viruses With Photoreactivation of the Bacteria. Wat. Res. vol. 21, No. 6, pp. 687-692, 1987.

(56) References Cited

OTHER PUBLICATIONS

Heaselgrave, W., et al., Solar disinfection of poliovirus and Acanthamoeba polyphaga cysts in water—a laboratory study using simulated sunlight. Letters in Applied Microbiology 43 (2006) 125-130.

Hijnen, W. A. M., et al., Inactivation credit of UV radiation for viruses, bacteria and protozoan (oo)cysts in water: A review. Water Research, 40 (2006) 3-22.

Wright, H. B., Comparison and Validation of UV Dose Calculations for Low- and Medium-Pressure Mercury Arc Lamps. Water Environment Research, vol. 72, No. 4 (Jul.-Aug. 2000), pp. 439-443.

Ho, C. K. Evaluation of reflection and refraction in simulations of ultraviolet disinfection using the discrete ordinates radiation model. Water Science & Technology—WST, 2421-2428, 2009.

Jagger, J., Near-UV Radiation Effects on Microorganisms. Photochemistry and Photobiology, vol. 34, pp. 761-768, 1981.

Jagger, J., et al., Evidence for Two Mechanisms of Photoreactivation in Escherichia coli B. Biophysical Journal vol. 5, 75-88, 1965.

Jin, S., et al., Polychromatic UV Fluence Measurement Using Chemical Actinometry, Biodosimetry, and Mathematical Techniques. Journal of Environmental Engineering, 2006, 132, 831-841.

Jubran, B. A. et al., Prediction of the performance of a solar water detoxi®cation system under Malaysian climatic conditions. Energy Conversion & Management 41 (2000) 1-12.

Kalogirou, S. A., Solar thermal collectors and applications. Progress in Energy and Combustion Science 30 (2004) 231-295.

Kehoe, S. C., et al., Batch process solar disinfection is an efficient means of disinfecting drinking water contaminated with Shigella dysenteriae type I. Letters in Applied Microbiology 2004, 38, 410-414.

Mani, S. K., et al., Comparative effectiveness of solar disinfection using small-scale batch reactors with reflective, absorptive and transmissive rear surfaces. Water Research 40 (2006) 721-727.

McGuigan, K. G., et al., Batch solar disinfection inactivates oocysts of Cryptosporidium parvum and cysts of Giardia muris in drinking water. Journal of Applied Microbiology 101 (2006) 453-463.

McGuigan, K. G., et al., Solar disinfection of drinking water contained in transparent plastic bottles: characterizing the bacterial inactivation process. Journal of Applied Microbiology 1998, 84, 1138-1148.

Meierhofer, R., Establishing Solar Water Disinfection as a water treatment method at household level. Madagascar Conservation & Development. 25-30 (2006).

Munoz, A., et al., Computational fluid dynamics for predicting performance of ultraviolet disinfection—sensitivity to particle tracking inputs. J. Environ. Eng. Sci. vol. 6, pp. 285-301 (2007).

Oates, P. M., et al., Solar disinfection (SODIS): simulation of solar radiation for global assessment and application for point-of-use water treatment in Haiti. Water Research 37 (2003) 47-54.

Pennell, K, G., et al., Phenotypic persistence and external shielding ultraviolet radiation inactivation kinetic model. Journal of Applied Microbiology 104 (2008) 1192-1202.

Quek, P. H., et al., Indicators for photoreactivation and dark repair studies following ultraviolet disinfection. J. Ind. Microbiol. Biotechnol. (2008) 35:533-541.

Quek, P. H., et al., Influence of photoreactivating light intensity and incubation temperature on photoreactivation of Escherichia coli following LP and MP UV disinfection. Journal of Applied Microbiology 105 (2008) 124-133.

Rakic, A. D. Algorithm for the Determination of Intrinsic Optical Constants of Metal Films: Application to Aluminum. Applied Optics, 34(22), 4755-4767.

Rahn, R. O., et al., Quantum Yield of the Iodide—Iodate Chemical Actinometer: Dependence on Wavelength and Concentration. Photochemistry and Photobiology, 2003, 78(2): 146-152.

Santoro, D., et al, Modeling Hydroxyl Radical Distribution and Trialkyl Phosphates Oxidation in UV-H2O2 Photoreactors Using Computational Fluid Dynamics. Environ. Sci. Technol. 2010, 44, 6233-6241.

Severin, B. F., et al., Kinetic Modeling of U.V. Disinfection of Water. Water Res. vol. 17(11) 1169-1678 (1983).

Sjogren, J. C., et al., Inactivation of Phage MS2 by Iron-Aided Titanium Dioxide Photocatalysis. Applied and Environmental Microbiology, Jan. 1994, p. 344-347.

Smith, R. J., et al., Effects of simulated solar disinfection of water on infectivity of Salmonella typhimurium. Letters in Applied Microbiology 2000, 31, 284-288.

Sutherland, J. C., Biological Effects of Polychromatic Light. Photochemistry and Photobiology, 2002, 76(2): 164-170.

Tembhurkar, A. R., et al., Study of Hydrodynamic Behavior of a Laboratory Scale Upflow Anaerobic Fixed Film Fixed Bed Reactor. Journal of Environ. Science & Engg. vol. 48 (2), 75-80 (2006).

Vidal, A., et al., High-Performance, Low-Cost Solar Collectors for Disinfection of Contaminated Water. Water Environment Research, vol. 72, No. 3 (May-Jun. 2000), pp. 271-276.

Mbonimpa, E. G., et al., Continuous-flow solar UVB disinfection reactor for drinking water. Water Research 46 (2012) 2344-2354.

* cited by examiner

| Viruses | Studies (data)[a] | k (cm²/mJ) (± 95% confidence interval; r²) |
|---|---|---|
| Poliovirus | 6 (55) | 0.135 (0.004; 0.79) |
| Rotavirus avg.[b] | 5 (58) | 0.095 (0.007; 0.62) |
| Rotavirus | 1 (20) | 0.044 (0.009; 0.88) int. 0.95[c] |
| Adenovirus avg. | 5 (98) | 0.024 (0.001; 0.87) |
| Adenovirus | 1 (29) | 0.018 (0.001; 0.88) |
| Hepatitis A | 3 (13) | 0.181 (0.028; 0.70) |
| Coxsackie virus | 2 (12) | 0.119 (0.006; 0.97) |
| Calicivirus avg. | 4 (49) | 0.129 (0.013; 0.41) |
| Calicivirus | 1 (20) | 0.190 (0.007; 0.98) |
| Calicivirus | 1 (9) | 0.109 (0.018; 0.82) |

[a]Number of studies, data points; [b]avg. = average all studies; [c]intercept (int.)

Figure 6

CONTINUOUS-FLOW SOLAR ULTRAVIOLET DISINFECTION SYSTEM FOR DRINKING WATER

CROSS REFERENCE TO RELATED APPLICATIONS

This application claims the benefit of, and is a U.S. §371 national stage entry of, International Patent Application Serial No. PCT/US2012/052767 filed Aug. 29, 2012 which is related to and claims priority to United States provisional application no. 61/528,551, filed Aug. 29, 2011, of identical title, the entire contents of which are incorporated by reference herein.

FIELD

This disclosure pertains to the field of drinking water treatment, specifically disinfection.

BACKGROUND

A large part of the world still lacks safe drinking water. The world health organization (WHO) estimates that roughly 1.1 billion people in developing countries do not have access to potable drinking water, and 2 million die every year due to drinking water-related diseases (WHO/UNICEF, 2006). Children are more vulnerable and every day the world loses roughly 3900 children below age 5 (WHO/UNICEF, 2004). A third of the people living in rural areas, slums and poor suburbs in developing countries use streams, ponds, rainwater from roofs, and poorly constructed wells that can be, contaminated with pathogens. The majority of contamination originates from human and animal fecal matter that, due to poor sanitation, ends up in streams and wells. These problems are acute in sub-Saharan Africa, and some countries in Oceania, eastern and southern Asia (Dejung et al., 2007; Gadgil, 1998). FIG. 1 shows world coverage of improved (conventional) drinking water systems; in Africa less than 50% of people have access to improved drinking water facilities. Forty two percent of the sub-Saharan African population use unimproved water sources, and are the largest population without access to improved drinking water sources, estimated to be around 528 million people, lives in South and East Asia (WHO/UNICEF, 2006).

There are six main categories of drinking water related diseases: —diarrhea; caused by some microbial pathogens, —ascaris, —dracunculiasis, —hookworm and other worms, —schistosomiasis, and —tracoma (Gadgil, 1998). These diseases can lead to disability, morbidity, and death. Also, chemical contamination, in particular arsenic and fluoride naturally present in some soils, is fairly common in developing countries. Lack of potable water is also one of the hindrances to economic development. Sickness in adults who are breadwinners affects the whole family in households. Diarrheal diseases in children reduce food absorption which in turn causes malnutrition, and impairs physical and mental development. Women in affected regions have to walk long distances to find potable water and spend time caring for sick children. Beside loss of life, another major consequence of lack of potable water is lost productivity due to sickness (Gadgil, 1998).

Solar disinfection debuted when Acra et al. (1984) observed inactivation of enteric bacteria due to solar radiation. Solar disinfection health benefits were emphasized when a study on Kenyan children under 5 years old found that children who drank water filled in PET plastic bottles exposed to sunlight for a day (SODIS: solar disinfection), showed a 16-24% reduction in incidence of all diarrhea episodes and a 86% reduction of cholera during an outbreak (Meierhofer, 2006). In 2006 a survey showed that 2 million people in poor communities in 20 countries use SODIS and as a result diarrhea incidence has been reduced by 30 to 70% (Meierhofer, 2006). This low cost technology, SODIS, consists of exposing a plastic bottle filled with water to sunlight of at least 500 W/m$^2$ for 5 hours (Oates et al., 2003). SODIS has been demonstrated as a system applicable in regions between latitude 35° North and 35° South, with at least a six-hour exposure to get a 3-4 $\log_{10}$ (99.9-99.99%) reduction in *E. coli, Vibrio cholera, Salmonella* spp, *Shigella* spp, Rotavirus, *Giardia* and a 2-3 $\log_{10}$ (99-99.9%) reduction in *Cryptosporidium* spp. (Meierhofer, 2006).

Disinfection Using Ultraviolet Radiation

The fundamental behavior of UV radiation as a disinfectant has been examined in detail. Some biomolecules within microorganisms, such as nucleic acids and proteins, have high absorption in the UV region of the electromagnetic spectrum and may undergo (mutagenic) photochemical alterations when exposed to UV (Jagger, 1967). The most common form of UV-induced damage within nucleic acids is photodimerization of adjacent pyrimidine bases. Another form of UV induced damage, apart from mutagenic effects to DNA, is loss in activity in some cell proteins; proteins with high amounts of tryptophan, tyrosine, phenylalanine amino acids are prone to UV damage (Blatchley and Peel, 2001). It is believed that mutagenic effects prevent transcription and the cell cannot replicate. If a cell cannot multiply, it can no longer cause infection (EPA, 2006).

Solar UV Disinfection

The antimicrobial effect of solar UV depends on the spectrum of radiation reaching the Earth's surface. The "near UV" range (290-400 nm) represents wavelengths of solar radiation that can reach the Earth. Peak DNA absorbance generally lies between 250 and 260 nm. However, radiation in this wavelength range is not included in the solar UV spectrum at the Earth's surface because of absorbance by atmospheric constituents. In addition to photodimerization, it has also been suggested that the damage occurs at the cell's chromophores and their prosthetic groups, also called endogeneous photosensitizers (FAD, NAD, heme, quinons, porphyrins, Fe—S cores) (Dejung et al., 2007). These chromophores are known to absorb radiation in the near-UV and above 400 nm. The shift of chromophores to other excitation states releases some energy and due to absence of energy acceptors, absorbance of these photons can lead to conformational changes in the chromophores, thus causing a biological activity loss. On the other hand, oxygen can act as energy acceptor and generate radicals, also known as reactive oxygen species, which are capable of causing damage to the cell membrane (Dejung et al., 2007). Reactive oxygen species also damage DNA by strand breaks and base changes. Also, in the presence of solar UV, exogenous photosensitizers such as humic substances react with oxygen and generate highly reactive oxidants such as hydrogen peroxide ($H_2O_2$), singlet oxygen and superoxides, which may display antimicrobial behavior (Kehoe et al., 2004). Exposure of *E. coli* to near-UV radiation has also been linked to impairment of membrane transport and the catalase enzyme system, leading to inactivation (Vidal and Diaz, 2000).

Action Spectra

An action spectrum of a microorganism provides a quantitative measure of its relative response at different wavelengths. For polychromatic UV sources, it is important to know what wavelengths are involved in a given action and how much effect each wavelength induces compared to other wavelengths. The action spectrum can also be described as the reciprocal of the dose required for a given effect versus wavelength (Jagger, 1967). The reciprocal of the dose versus wavelength shows that wavelengths that require the lowest dose for a given effect are the most efficient. As an example, FIG. 2 shows the relative germicidal effectiveness for inactivating *E. coli*. FIG. 2 shows that to inactivate *E. coli* using wavelength in near UV, for example using 3000 Å (300 nanometers; nm), the dose required is roughly 10 times the dose required at around 2600 Å (260 nm), it jumps to 1000 times at around 3400 Å (340 nm) and 10000 times at 4000 Å (400 nm).

Microbial Cell Repair Mechanisms

Some microorganisms are equipped with DNA repair mechanisms to respond to UV damage. There are four main enzymatic repair mechanisms; one is the light-dependent repair mechanism and three are dark-repair mechanisms. Light-dependent repair reverses UV-induced damage for pyrimidine dimers with the help of photolyases (photoreactivating enzymes). These enzymes work in presence of UV and visible light (300-600 nm). Of the dark-repair mechanisms, the most commonly observed repair is nucleotide excision repair (NER) and is known to be slow. NER repair occurs on pyrimidine dimers and other lesions not caused by UV. Some *E. coli* cell proteins that participate in NER include DNA polymerase I, ligase, Uvr A, Uvr B, Uvr C and Uvr D. A second dark-repair process is known as ultraviolet excision repair. It occurs in only pyrimidine dimmers caused by UV radiation and is relatively faster than NER. The third dark-repair mechanism involves an enzyme known as glycosylase to repair pyrimidine dimers (Blatchley and Peel, 2001).

Solar Radiation

Solar radiation is electromagnetic energy that originates from the Sun. The outer layer surface of the Sun is made up of cooler gases which are strong energy absorbers. This layer has properties similar to a blackbody, with a temperature estimated to be around 5777 K. The energy absorbed and reemitted by the black body is the radiation that is emitted by the Sun. The Earth, which is $1.5*10^{11}$ m away of the Sun, receives roughly $1.5 \times 10^{18}$ kW·h per year of solar radiation energy, or approximately 28,000 times the world energy consumption per year (Duffie and Beckman, 1991).

Due to eccentricity of the Earth's orbit around the Sun, the energy that is received at the outer edge of the Earth's atmosphere (also known as the solar constant) varies daily, with a yearly average energy of 1367 W/m² at an average solar-earth distance of 93 million miles. This yearly variation solar constant variation is shown in FIG. 3.

Solar radiation received at the surface of Earth varies with latitude, longitude and ordinal date of the year. In addition, due to Earth's rotation, for an observer on Earth's surface the Sun sweeps an arc from sunrise in the morning to sunset in the evening with high energy at noon when the Sun is at zenith. The more you move away from the equator toward the South or North Pole, the more solar rays become inclined and have to travel a longer distance through Earth's atmosphere, and hence more attenuation they experience. The angle at which the solar rays strike a horizontal surface on Earth surface is called the incidence angle. Solar radiation also varies according to altitude and local climate. The spatial distribution of solar radiation is illustrated in FIG. 4. On this graph the world solar radiation distribution is expressed in Kw·h per square meter per year. The highest energy is located in regions near the tropics in regions depicted with dark red color and lowest as you approach the poles in regions marked with yellow color. Cloud cover is also important to attenuation of solar radiation. As an example, near the equator solar rays tend to be perpendicular to horizontal surfaces, but due to the presence of clouds formed by equatorial rain forests and movement of winds, solar radiation is often less intense than radiation observed in the deserts (e.g. Sahara and Kalahari) near the tropics in Africa (FIG. 4).

Solar Radiation Collection

Background on Solar Radiation Collection Technologies

Solar energy collectors are devices that collect, concentrate and transfer energy to a fluid or convert it to electric current. These collectors can be classified with respect to whether they are concentrating or non-concentrating. They can also be classified with respect to whether they are stationary or tracking. In the category of stationary collectors, two types of collectors are mostly used in solar energy: Flat plate collectors (FPC) and Stationary compound parabolic collectors (CPC).

In the category of tracking collectors, there are many geometries that are in use and among them the basic geometries include: Parabolic trough collector (PTC), Cylindrical trough collector (CTC), and Linear Fresnel reflector (LFR).

Types of Collectors

Flat Plate Collectors (FPC)

Flat plate collectors are more economical than most other collectors (Kalogirou, 2004). They are mostly used in low temperature fluid heating applications. In this device, pipes that carry the fluid run on a flat absorber (e.g. sheet metal) with insulation covers on sides and bottom, and glazing glass at the top (FIG. 2.7). For heating applications the absorber sheet metal is coated with a black color and the glass cover serves as a protection against convection and reradiation losses. The glass cover transmits short wavelength radiation from the sun but it is opaque to long-wave thermal radiation from the absorber plate. Flat plate collectors are mostly static and they are oriented toward the equator; oriented south in the northern hemisphere and oriented north in southern hemisphere (Kalogirou, 2004).

Compound Parabolic Concentrator (CPC)

The CPC is a unit of two parabolic sections facing each other. The non-tracking CPC was originally designed for solar thermal collection purposes: CPCs include a reflector system that directs solar radiation to the absorber without tracking the sun (independent on incidence angle). Using one or multiple internal reflections, the CPC allows collection of nearly 70% of global solar radiation without a tracking system. This system also is able to collect both diffuse and beam radiation. Diffuse radiation represents roughly 50% of total solar UV radiation (Vidal and Diaz, 2000). FIG. 5 shows the geometric characteristics of a CPC; it is made up two reflective side walls and a receiver pipe or plane is fixed at the bottom where those walls meet. The angle between the diagonals is the acceptance angle (θ). The acceptance angle is also defined as the angle through which all radiation with incidence angle smaller than acceptance angle strikes the absorber. The CPC takes the radiation received at the aperture area and concentrates it to a smaller collection area; the concentration ratio (C) is defined as following in Equation 2.1:

$$C = a/a' = 1/\sin \theta. \qquad \text{Equation 2.1}$$

Where a is aperture size, a' is the receiver size, and θ is the acceptance half-angle.

The absorber area can have various configurations depending upon use; it can be a flat area or a tube as shown in FIG. 5. A CPC longitudinal axis can be oriented east-west or north-south. When it is oriented east-west, it can collect radiation along daily solar movement without tracking. The transversal axis is tilted to the south in northern hemisphere and tilted north in southern hemisphere with little seasonal adjustment. For stationary CPCs in this mode, the acceptance angle should cover declination of the Sun from summer to winter solstices (47° equivalent to 23.5° for each solstice). When the CPC longitudinal axis is oriented in the north-south direction, it should be tilted to track the Sun, such that the solar incidence angle remains within the acceptance angle.

Tracking Collectors

Almost all tracking collectors are also concentrators; a tracking system follows the Sun's movement in the sky. It should maintain its ability to track the Sun during intermittent cloud cover and clear sky, protect the collector against severe environmental conditions such as wind, overheating and alarm in case of failure. The most popular types of tracking concentrators are described below.

Parabolic Collector

A reflector of parabolic shape is mounted in the background of the evacuated pipe. The reflector is positioned in the direction of the Sun in such a way that the solar rays hit perpendicularly to the plane of the reflector and get reflected to a focal point or line. Most parabolic collectors, except compound parabolic collectors, require a Sun tracking system that allows it to rotate around an axis oriented north-south or east-west or both. This type can achieve very high concentration since a large area can be concentrated on a very small area.

Parabolic collectors can be categorized in two major types; parabolic trough and parabolic dish (circular). For a parabolic trough the energy is concentrated to a focal line while a parabolic dish directs collected radiation to a focal point. The size of the tube or collection point depends on the size of concentrated Sun's image and manufacturing tolerances of the collector. A parabolic trough with an axis facing north-south collects more solar energy than an east-west oriented system in summer, while east-west system collects more energy during winter. However, over a year, the energy collected is slightly higher for a system with a north-south orientation. Also, parabolic dishes have a double-axis tracking system (Kalogirou, 2004).

Linear Fresnel Reflector (LFR)

This collector is a composite of individual mirror strips which concentrate radiation on a fixed-point receiver. This system has an advantage in manufacturing as the reflecting strips are flat and do not require precision curving compared to parabolic collectors. In addition each strip can be maintained separately. The receiver is usually static and mirror strips require a tracking system to direct radiation to the receiver.

Collector Materials

Reflecting materials make it possible to deviate and concentrate solar radiation intensity by collecting solar rays on a certain area and transferring them to a smaller area. The ideal or maximum concentration gained equals the ratio of the two areas. The ideal concentration would correspond to a system that reflects, transmits and collects 100% of energy falling on the collector, and in reality such a system is not feasible, because of imperfections in manufacturing and wear and tear from UV (this will be discussed later in reflecting materials section). Transmitting materials are used for covers of the system and tubes, allowing radiation to be transmitted to the target fluid or the absorber.

The integrated solar reflectance at incidence angle θ ($R_{sol}(\theta)$) is defined as (Equation 2.2) (Nostell, 2000).

$$Rsol(\theta) = \frac{\int_{\lambda 1}^{\lambda 2} R(\lambda, \theta) * Ssol(\lambda) * d\lambda}{\int_{\lambda 1}^{\lambda 2} Ssol(\lambda) * d\lambda} \qquad \text{Equation 2.2}$$

Where $R(\lambda, \theta)$ is the wavelength dependent reflectivity at angle θ, $S_{sol}(\lambda)$ is the spectral solar irradiance and the limits on integration are the boundaries of UV wavelength. Similarly, the replacement of R by T allows calculation of the integrated solar transmittance (Equation 2.3) (Nostell, 2000).

$$Tsol(\theta) = \frac{\int_{\lambda 1}^{\lambda 2} T(\lambda, \theta) * Ssol(\lambda) * d\lambda}{\int_{\lambda 1}^{\lambda 2} Ssol(\lambda) * d\lambda} \qquad \text{Equation 2.3}$$

For reflectors a portion of energy received is lost through wavelength-dependent absorbance ($A_{sol}(\theta)$) (Equation 2.4). The integrated absorbance equals 1 minus integrated reflectance (Equation 2.5) (Nostell, 2000).

$$Asol(\theta) = \frac{\int_{\lambda 1}^{\lambda 2} (1 - R(\lambda, \theta)) * Ssol(\lambda) * d\lambda}{\int_{\lambda 1}^{\lambda 2} Ssol(\lambda) * d\lambda} \qquad \text{Equation 2.4}$$

$$A(\lambda) = 1 - R(\lambda) \qquad \text{Equation 2.5}$$

The total integrated reflectance (Equation 2.6) is equal to the sum at all incidence angles; in the equation below W (θ) is the angular weight function; the limits are angles of incidence which vary from 0° to 90°.

$$Rsol = \frac{\int_0^{90°} Rsol(\theta) * W(\theta) * d\theta}{\int_0^{90°} W(\theta) * d\theta} \qquad \text{Equation 2.6}$$

Similarly, by replacing R by T we get integrated transmittance. The sum of wavelength-dependent reflectance, transmittance and absorptivity equals 1 (Equation 2.7).

$$R(\lambda) + T(\lambda) + A(\lambda) = 1 \qquad \text{Equation 2.7}$$

Reflecting Materials

UV Reflecting Metal Sheets

Aluminum has been used for long time as a reflector of solar rays. Compared to other metal materials such as stainless steel and silver, aluminum is relatively inexpensive and can offer high reflectance (more than 90%) and good coverage of the solar spectrum. Among aluminum, stainless steel, and silver, aluminum displays the highest reflectance at the lower limit of the spectrum of solar UV radiation received at Earth's surface (~290 nm). At this wavelength, stainless steel has 55% reflectance and silver has less than 10% reflectance.

However, the performance of aluminum metal deteriorates due to oxidation. Surface treatments such as anodizing and polyvinyl fluoride coating increase the useful life of reflective aluminum. Total reflectance includes specular and diffuse reflectance. Specular reflectance consists of radiation reflected at an angle which mirrors the incident light angle while diffuse reflectance consists of radiation reflected at other angles. At roughly 290 nm, unprotected aluminum loses around 15% of reflectance in 7 years, and in 14 years it loses around 60%. Protection of aluminum using anodization method slows down this reflectance loss. This protection caused around a 10% reduction in reflectance at low wavelength (near 300 nm) but shows an improvement in time of deterioration. A PVF protection showed a 20% less reflectance loss after 4 years compared with non PVF-protected Aluminum.

All-Polymeric UV Reflecting Film

In the 1970's and early 80's, several US companies developed an interest in research related to solar application materials. One of the promising reflecting materials that was patented by DOW Chemical was an All-Polymeric material. This is a plastic material that is inexpensive, light in weight, can resist harsh environmental stresses and can be designed for a specific wavelength reflectance to suit different purposes. This film is made of alternating thin layers of polyvinyl fluoride and polymethylmethacrylate. These materials have different refractive index (n) that promotes internal reflection. This material is a promising reflection material for solar UV application since it shows a good reflectance (around 90%) for radiation wavelengths of 300-400 nm for 1300 polymer layers.

Transmitting Materials

Potential materials for use in solar UV applications for transmittance are silica based materials such as fused silica and quartz due to good transmittance (>90%) of UVA and UVB wavelengths. Other materials such as transparent polystyrene and Polyethylene terephthalate (PET) used in SODIS (solar disinfection) bottles (0.45-0.55 mm thick wall) also transmit wavelengths in near-UV (Mani et al., 2006). Polystyrene has 20 to 40% transmittance between 290 and 310 nm, around 70% between 310 and 350 nm and 85% above. PET has roughly 80% transmittance above 320 nm but poor transmittance below 320 nm (McGuigan et al., 1998, Heaselgrave et al., 2006). Also, fluoroethylenepropylene (FEP) resins are used to make plastic tubes that offer variable UV transmittance (around 50% for 0.79 mm thick wall).

UV Dose-Response Relationship Studies

Dose-response relationships allow determination of sensitivity of microorganisms (inactivation rate) to UV. This relationship between dose and microbial response is generally obtained from bench-scale experiments in which well-defined UV doses are delivered to a microbial population. In most cases, the device used to deliver UV radiation to the microbial target is a shallow, well-mixed reactor under a collimated beam.

The UV dose-response behavior of microorganisms follows different kinetic models; there are microorganisms (for example bacteriophages) for which UV dose-response behavior is effectively described by single event (first order) kinetics, at least for a limited range of UV doses and inactivation responses. Others follow the Series-Event model, whereby a microorganism has to pass through a series of photochemical events before starting inactivation (Severin et al., 1983). The latter behavior presents a shoulder at the dose response curve. Pennell et al. (2008) developed the Phenotypic Persistence model in which the tailing behavior observed for some microorganisms was accounted for. This persistence was attributed to microbial phenotypic variation, or shielding of microorganisms by particles or microbial aggregates (Pennell et al., 2008).

Hijnen and Medema (2005) and Hijness et al. (2006) presented reviews of dose-response behavior for several relevant pathogenic microorganisms from numerous studies generated using low pressure lamps (254 nm). Data from dose-response relationships for two pathogenic viruses, adenovirus and poliovirus, were fitted using linear regression and the resulting kinetic coefficients of these two viruses were tabulated together with other common pathogenic viruses in drinking water. Of the viruses, a double stranded DNA adenovirus was reported to be relatively UV resistant as compared to other viruses; it has the smallest inactivation rate constant (k) of 0.024 $cm^2$/mJ. Also in these reviews, dose-response curves for two common pathogenic bacteria, *Campylobacter jejuni* and *E. coli* O157 were fitted using linear regression; kinetic coefficients for these two bacteria and other common bacteria in drinking water are presented in FIG. 6. Among bacteria presented in FIG. 6, *Legionella pneumophila* is the most UV resistant (k=0.444 $cm_2$/mJ) and *Vibrio cholera* is the least UV resistant (k=1.341 $cm^2$/mJ). Presented information indicates that *C. parvum* (k=0.243 $cm^2$/mJ) is slightly more UV resistant than *Giardia* (k=0.282 $cm^2$/mJ). An important point is that the Hijnen and Medema (2005) and Hijness et al. (2006) reviews used linear fits for all microorganisms and accounted for the shoulder effect using an intercept on the response axis.

Solar UV Dose-Response Relationship Studies

Solar radiation, which is a polychromatic source with spatial and temporal variations, poses a challenge quantifying its effect on microorganisms with respect to these variations. Also, researchers have tried to simulate solar radiation using solar simulators but it is difficult to get a representation of solar radiation distribution around the globe or the region of interest. Others have used actual solar radiation to conduct experiments, and hence their results are specific for the area where the experiment took place. The following text will review findings from some studies that used ambient solar radiation and solar simulators to generate solar UV dose-response behavior for common pathogenic organisms found in drinking water.

Viruses and Bacteriophages

Heaselgrave et al. (2006) used a solar simulator to expose Poliovirus to a global solar irradiance of 850 W·$m^{-2}$ (UVA and visible wavelengths from 320 to 700 nm) and found that a 4.3 $log_{10}$ and 2.2 $log_{10}$ inactivation was achievable at 1.2*$10^6$ mJ/$cm^2$ and 6*$10^5$ mJ/$cm^2$, respectively. For the conditions of their experiments, these doses required 4 and 2 hours of exposure, respectively.

Bacteria

SODIS has been proven to be effective for inactivation of bacteria. Berney et al. (2006) generated solar UV dose-response relationships for four types of bacteria, *E. coli* K-12 MG1655, *Salmonella typhi, Shigella flexneri*, and *Vibrio cholerae*. The exposure was performed using summer sunlight in Switzerland at UV wavelengths ranging from 350-400 nm, 37° C., for 6-7 hours exposure; these conditions correspond to a total UV dose of approximately 2400 kJ/$m_2$ (2.4*$10^5$ mJ/$cm^2$). The dose-response curve for *E. coli* shows the curve with a shoulder; *E. coli* demonstrated essentially no inactivation until a threshold dose of approximately 1200 kJ/$m_2$ (1.2*$10^6$ mJ/$cm^2$) was exceeded and 6.5 $log_{10}$ inactivation was achieved after receiving a dose of 2.4*$10^5$ mJ/$cm^2$. *Shigella flexneri* (lower left) required delivery of a threshold dose of approximately 400 kJ/$m^2$ (4*104 mJ/$cm^2$) before inactivation was observed, 6.5 $log_{10}$ inactivation was achieved at a solar UV dose of 2400 kJ/m². The dose response for *Salmonella typhi* fit with a linear regression. Relative to *E. coli*, *S. thyphi* were resistant to solar UV exposure; only 1.5 $\log_{10}$ inactivation was achieved at a dose of $2.4*10^6$ mJ/cm². *Vibrio cholerae* solar UV dose-response behavior was fit with linear regression and demonstrated 6.5 $\log_{10}$ inactivation at 900 kJ/m² ($9*10^4$ mJ/cm²).

Since the radiation had a cutoff at 350 nm it does not accurately represent regions where solar UV radiation may be received at wavelengths down to 290 nm. For example, in an experiment conducted under Kenyan solar conditions (intensity of 106 mW·m⁻²), 5-6 $\log_{10}$ units reduction of *Salmonella typhi* was reached at a dose of 229 mJ/cm² (6 hours exposure) and total non-infectivity at 8 hours (a dose of 305 mJ/cm²) (Smith et al., 2000, Berney et al., 2006).

Temperature is known to affect non thermo-tolerant microorganisms. *Salmonella typhi, E. coli* and *Shigella flexneri* were inactivated faster for temperatures above 50° C. and *Vibrio cholerae* is rapidly inactivated for temperatures above 40° C.

Protozoa

Two species of protozoa, *Cryptosporidium parvum* and *Giardia lamblia*, are of concern in drinking water. They have caused many fatal disease outbreaks and are resistant to chlorine. Due to *Cryptosporidium*'s robust oocyst structure and the ability of *Giardia* to form cysts, both of these protozoan parasites can survive in water for a long time. McGuigan et al. (2006) exposed samples containing *Cryptosporidium parvum* oocysts and a surrogate of *Giardia lamblia* (*Giardia muris*) cysts to UV radiation from a solar simulator with a lower wavelength limit of 320 nm and an irradiance of 870 W·m⁻² (UVA portion was estimated as 45 W/m²) at an ambient temperature of 40° C. Infectivity essays (performed using neonatal mice) of *C. parvum* showed non-infectivity after 10 hours of exposure, corresponding to a dose of $3*10^6$ mJ/cm² ($1.6*10^6$ mJ/cm² UVA). *Giardia muris* cysts were rendered completely non-infective to mice after 4 hours exposure, corresponding to a dose $1.3*10^6$ mJ/cm² ($6.5*10^{-4}$ mJ/cm² UVA). The authors indicated that *Giardia muris* used in this study were believed to have higher UV resistance than *G. lamblia*, thus the solar UV dose-response of *G. muris* was assumed to represent a conservative estimate of the UV dose-response behavior of *G. lamblia* found commonly in water (McGuigan et al., 2006).

SUMMARY

This disclosure represents an extension of the SODIS concept to develop a continuous flow solar UV reactor to disinfect water intended for low-income communities in developing countries. However, SODIS systems appear to depend largely on wavelengths of solar UV radiation greater than 320 nm, where antimicrobial activity is slow and generally ineffective. As such, it is likely that SODIS systems accomplish microbial inactivation by thermal processes (i.e., heating of water), as opposed to photochemical processes. The disclosure described herein accomplishes microbial inactivation through photochemical processes. In addition, the disclosure described herein is based on continuous-flow operation, whereas SODIS systems are operated in batch mode.

A continuous-flow solar UV reactor will benefit from a solar radiation collection system intended to collect and concentrate solar radiation. The radiation collected will be transferred to a UV-transparent pipe through which water flows. The system will be modeled to simulate the UV intensity distribution in the pipe, and with the knowledge of fluid mechanics in the pipe, the UV dose distribution can be estimated. Laboratory microbial dose response studies together with the dose distribution will enable an assessment of the performance of the reactor.

Due to lack of public drinking water supply in remote, poor communities in developing countries, one of the solutions to the drinking water issue is to find a small, inexpensive "point-of-use" system that can be used by one household or group households to produce potable water. Ideally, such a system should not require chemicals or electricity and should require minimal maintenance. It should be designed with consideration of environmental, ethical, cultural, social and economical aspects of the community for which it is intended.

"Point-of-Use" solar UV disinfection is a method that can address the problem of pathogens in drinking water in regions that receive intense solar radiation. This system is different from conventional UV systems; it does not use lamps, electricity or batteries. The system can also serve people in refugee camps, disaster areas and remote rural areas in developing countries where potable water is scarce. In addition, systems that use solar energy are increasingly preferred since the sun is a perpetual source of energy. It may also be implemented in developed countries in areas that experience intense solar UV irradiation on a regular basis.

The disclosure includes a solar disinfection reactor comprising a compound parabolic collector, wherein the collector includes a reflective coating, a receiver pipe supported by the bottom of the compound parabolic collector, a water tank fluidly coupled to the receiver pipe, a fluid flow system for delivering water under constant flow from the water tank through the receiver pipe, and wherein the collector is configured to collect solar ultraviolet radiation and utilize the radiation to disinfect water.

The disclosure also includes a method of microbial inactivation prediction by solar radiation wherein the SMARTS model is used to predict solar ultraviolet intensity as a function of geographic location and time, the method comprising the steps of utilizing a numerical modeling procedure to simulate ultraviolet dose distribution delivery, utilizing a segregated flow model to predict dose response behavior of a reactor, and utilizing the numerical modeling procedure and the segregated flow model to predict microbial inactivation by the reactor.

BRIEF DESCRIPTION OF THE DRAWINGS

The above-mentioned and other features of this disclosure, and the manner of attaining them, will become more apparent and the disclosure itself will be better understood by reference to the following description of embodiments of the disclosure taken in conjunction with the accompanying drawings, wherein:

FIG. 6 is a table of inactivation rate constants for viruses based on linear regression (i.e., single-event model), based on 254 nm UV radiation.

Figure 1:
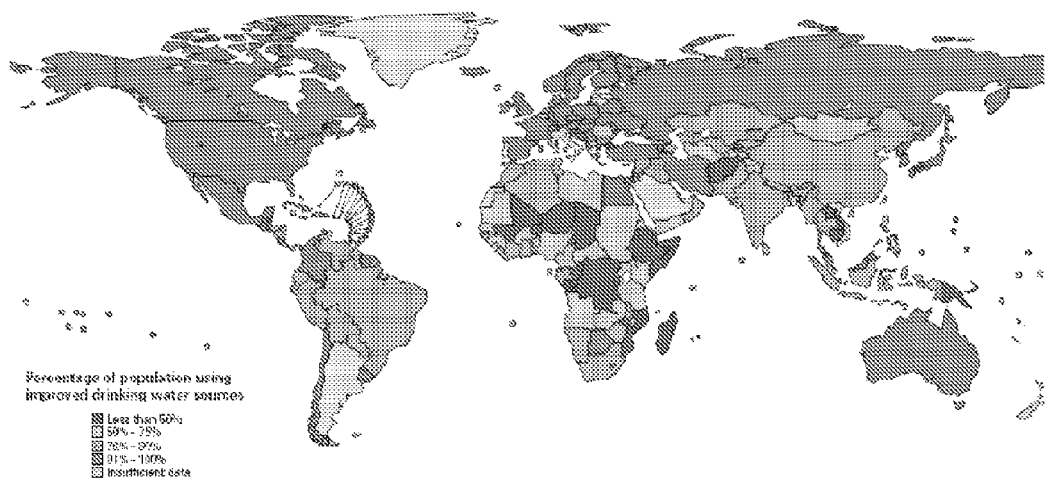
FIG. 1 is a world map showing world coverage of improved drinking water sources in 2002.
Figure 2:
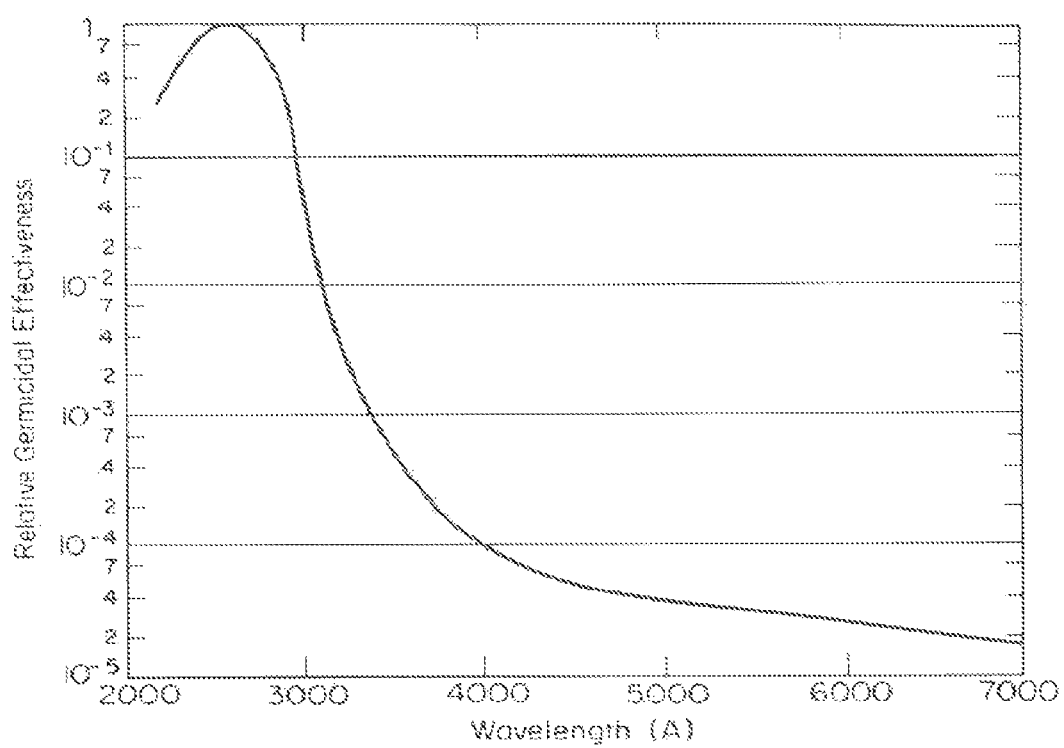
FIG. 2 is a chart illustrating the action spectrum for inactivation of *E. coli*.
Figure 3:
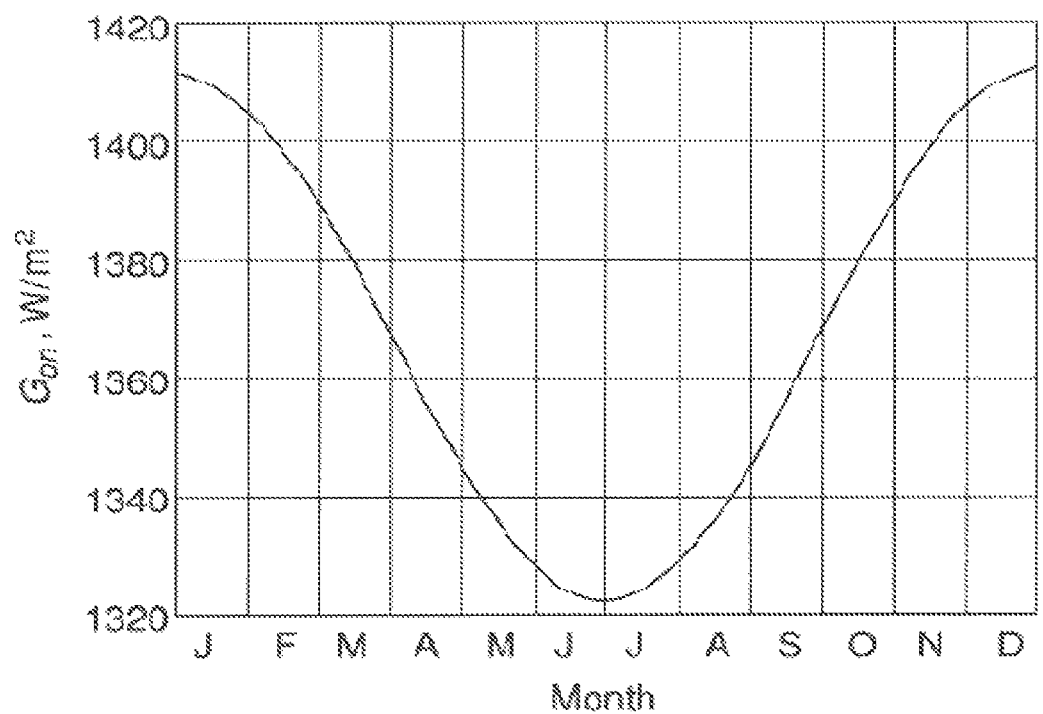
FIG. 3 is a chart demonstrating variation of extraterrestrial solar radiation (solar constant) with time of the year.

Corresponding reference characters indicate corresponding parts throughout the several views. Although the drawings represent embodiments of the present disclosure, the drawings are not necessarily to scale and certain features may be exaggerated in order to better illustrate and explain the present disclosure.

DETAILED DESCRIPTION OF THE EXEMPLARY EMBODIMENTS

The embodiments disclosed below are not intended to be exhaustive or limit the disclosure to the precise forms disclosed in the following detailed description. Rather, the embodiments are chosen and described so that others skilled in the art may utilize their teachings.

Organization of the Disclosure

Figure 7:
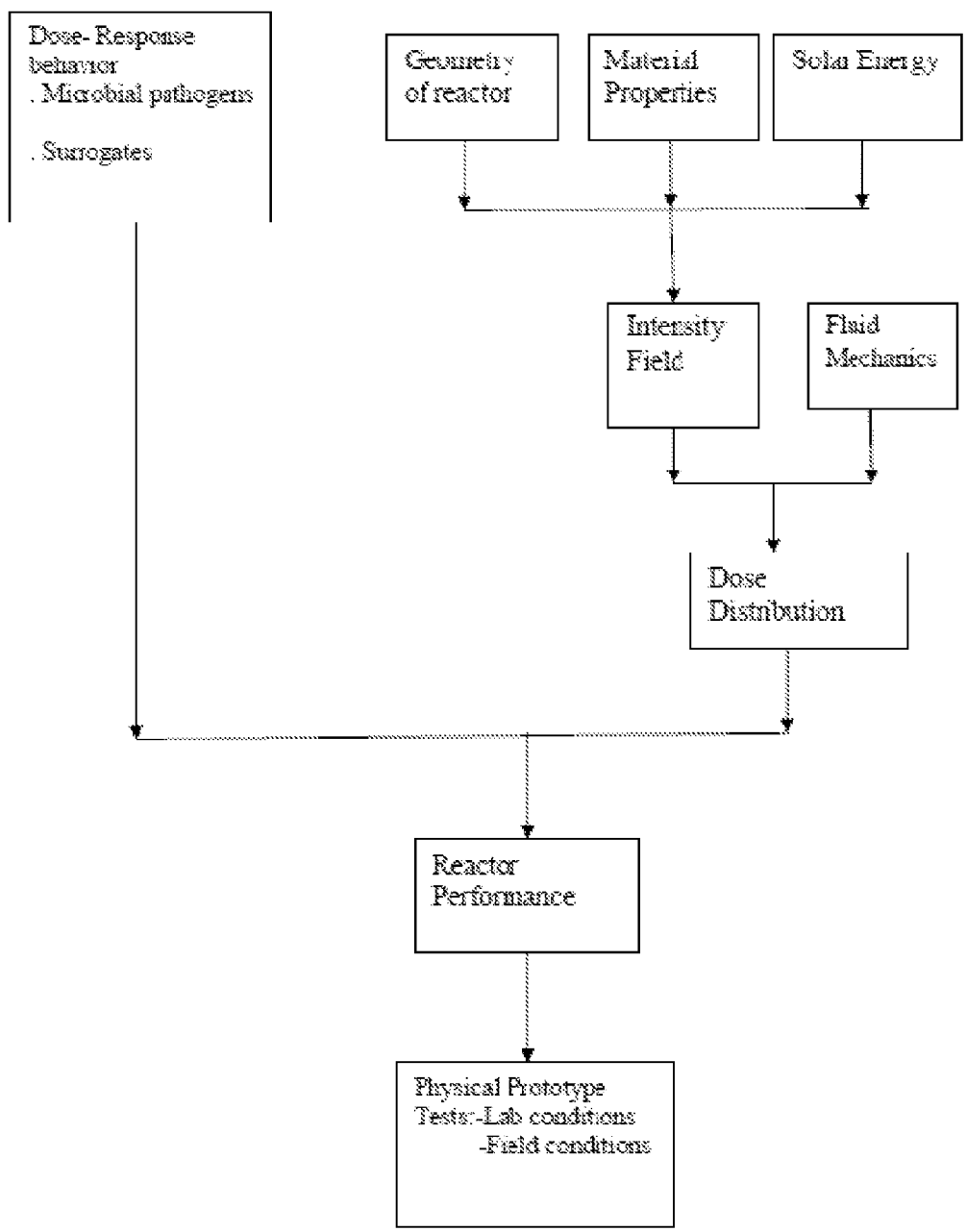
FIG. 7 is a flow chart showing organization of this disclosure.

The development of the solar UV reactor in this disclosure is outlined in FIG. 7. Three main tasks were performed. The first task involved dose-response studies in which, using bench scale tests, the response of microorganisms exposed to a wavelength-dependent UV dose was determined. The second task was solar UV resource estimation. The third task was solar UV reactor modeling. The latter task involved development of reactor geometry, intensity field simulation (computed using geometry, material properties and solar energy), dose distribution (computed using intensity field and flow characteristics), reactor performance determination (computed using dose distribution and dose-response behavior of microorganisms), and validation of the numerical modeling using a prototype.

Solar UV Wavelength-Dependent Inactivation of Viruses and Bacteria

Many studies have included examinations of the effectiveness of solar radiation on pathogenic and non-pathogenic microorganisms in water based on dose-response measurements performed using monochromatic and polychromatic sources of radiation, but there are fewer studies on wavelength-dependent dose-response behavior for UV wavelengths that characterize the solar wavelength spectrum available at the Earth's surface. Another challenge is that solar UV radiation varies spatially and in time, with variations in intensity and spectral range. Hence, wavelength-based dose-response curves are needed for predictions of spatial and temporal variation of effectiveness for solar disinfection systems.

This disclosure used non-pathogenic microorganisms as surrogates to microbial pathogens to assess the inactivation potential of solar UV radiation. Dose-response experiments were performed using MS2 bacteriophage, a single stranded RNA bacteriophage, in the family of Leviviridae, with a genome size of 3569 nucleotides, and 24-26 nm in diameter. This phage is commonly considered as a surrogate for pathogenic human enteric viruses, widely used in experimentation to validate UV reactors and is more resistant to UV exposure than many microbial pathogens (Fallon et al., 2007; EPA, 2006). Also, T4 bacteriophage was used here as a surrogate for DNA viruses. It is a double stranded DNA bacteriophage in the family of Myoviridae, with a genome size of 336,000 nucleotides, 65-80 nm in diameter and 120 nm in length. T4 is known to be more susceptible to UV at 254 nm than MS2 (Fallon et al., 2007). These two bacteriophages are not harmful to humans and can be easily managed in laboratory experiments. E. coli ATCC 15597 and ATCC 11303 from American Type Culture Collection (ATCC) were used as a surrogate for bacteria and hosts to MS2 and T4, respectively. Dose-response behavior of E. coli (ATCC 15597) was also quantified.

Materials and Methods

An ORIEL instrument fitted with a 10 Watt medium-pressure mercury lamp which provides an output spectrum with wavelengths ranging from 280 to 460 nm was used as the UV source. To distribute the radiation beam evenly on the target, a UV FUSED SILICA—Spectrosil2000® diffuser was fitted on the instrument. Optical filters (from Andover Corporation) were used to isolate narrow wavelength bands of the output spectrum of the lamp. The transmittance spectra of these filters were measured using a UV-Visible spectrometer (Varian, Cary 300 BIO). These filters were characterized by (nominal) half-height band widths of 10 nm and are identified with the wavelength corresponding to the peak of the their respective transmittance spectra. The peak transmittance wavelengths for these filters were spaced at roughly 10 nm increments across the UVA and UVB spectra.

A conventional UV low pressure mercury lamp, essentially with a monochromatic output ($\lambda=254$ nm) and a XeBr excimer lamp ($\lambda=282$ nm) were also used. These sources were both housed in flat-plate collimators which allowed delivery of collimated, monochromatic UV radiation that was quantifiable (in terms of incident intensity) by the use of a radiometer (IL1700, International Light). Dose-response studies at $\lambda=254$ nm are well established and measurements from this wavelength were used as benchmark for comparison.

A continuously-mixed batch reactor (CMBR) of a pure culture of microorganisms was placed under a collimated radiation beam; the free surface of the microbial suspension was perpendicular to the radiation beam. A batch system was used since it is difficult to determine photochemical reaction kinetics constants for continuous-flow systems (Blatchley, 1997). The microbial suspension was contained in a Petri dish under the UV beam and a magnetic stirrer was used to mix the microbial suspension. For each sample the transmittance of the microbial suspension was measured using a UV-visible spectrometer (Varian, Cary 300 BIO). Also, at the interface of media: air and water, reflection and refraction were taken into account using Snell's law (Pennell, 2005).

The intensity imposed on the liquid surface in the Petri-dish was measured using a radiometer (IL1700, International Light).

Bacteriophage Analysis Detection Using Plaque Essay Method

Bacteriophage MS2 (ATCC 15597B1), a single stranded RNA bacteriophage, was grown using *Escherichia coli* (ATCC 15597) as a host, as follows:

1. Propagation of *E. coli:*

An aliquot from ATCC containing *E. coli* was rehydrated with 1 mL of tryptone-yeast extract (TYE) broth. The TYE broth contained 10 g/L of Tryptone, 1 g/L of yeast extract, and 8 g/L of sodium chloride in de-ionized water. This mixture was sterilized using an autoclave (Napco model 8000-DSE).

A few drops of suspension were inoculated on an agar (TYE+15 g/L agar) plate and incubated at 37° C. for 24 hours.

2. Propagation of MS2:

Twenty four hours old *E. coli* colony was removed from an agar plate, added to TYE broth, and incubated at 37° C. until the absorbance (600 nm) of the solution reached between 0.2 and 0.3 per cm (measured using spectrometer). This took roughly 2-3 hours, at this stage *E. coli* growth was assumed to be in log-phase of bacterial growth. A sterile solution of Ca-glucose (1 g/L glucose, 3 g/L $CaCl_2$, and 10 mg/L Thiamine) was added to the suspension to facilitate bacteriophage attachment to the host.

A few MS2 solution drops from the ATCC Aliquot were added to the actively growing *E. coli* and incubated at 37° C. for 24 hours.

The suspension was filtered through a 0.22 μm Millipore membrane filter and stored at 4° C. This solution contained an MS2 concentration of roughly $10^{10}$ PFU/mL. The information for MS2 handling was obtained from ATCC product information sheet for ATCC 15597-B1, and the UV Disinfection Guidance Manual, USEPA (2006).

3. Plaque Assay:

Agar plates were prepared by pouring molten and sterile (autoclaved) agar into petri-dishes. Five serial dilutions of MS2 samples were prepared and all samples were analyzed in triplicate. 100 μL of *E. coli* and 10 μL MS2 were added into 2.5 mL of soft-agar (TYE+7.5 g/L agar).

Soft-agar was overlaid on agar plates, allowed to solidify and incubated for 24 hours at 37° C. Visible MS2 plaques were formed on the plates and counted.

T4, a double stranded DNA bacteriophage, was also enumerated using the top agar method with *E. coli* ATCC 11303 as host. Handling was similar to the methods used for MS2.

*E. coli* Analysis

*E. coli* (ATCC 15597) was washed twice by centrifuging using sterile DI water to remove nutrient media, and re-suspended in saline water (7% NaCl) before each dose-response experiment. Removal of the media prevents growth during experiment. After exposure, *E. coli* were grown on agar (TYE+15 g/L agar) in a Petri dish and enumeration was done by counting colony forming units (CFUs). The concentration in liquid phase is expressed in CFU/mL.

Results

Viruses

MS2 was first analyzed at 254 nm to validate bacteriophage dose-response behavior against other studies. There are numerous studies of bacteriophage dose-response behavior for MS2 at 254 nm since this is a wavelength commonly used in conventional low pressure UV reactors. EPA (2006) compiled MS2 dose-response data from various selected studies, and an upper and lower bound of an accepted range of dose-response behavior at 254 nm was generated. For MS2 used in this investigation, 254 nm data were fit with a first-order curve ($R^2=0.97$) with inactivation constant of 0.0561 $cm^2$/mJ. The measured UV dose-response behavior of MS2 used in this research agrees with the EPA dose-response range at 254 nm. A similar experiment was performed using a XeBr excimer lamp with an output of 282 nm. At this wavelength, data followed a first-order trend ($R^2=0.93$) and an inactivation constant of 0.0303 $cm^2$/mJ. In the solar UVA range, the dose-response experiment was done for MS2 and T4. At 297 nm MS2 and T4 data are fit with first-order trend with $R^2$ of 0.93 and 0.94 and inactivation constant of 0.0132 and 0.0387 $cm^2$/mJ, respectively. At 310 nm first-order fits ($R^2=0.66$ and $R^2=0.94$) yielded inactivation constants of 0.0039 and 0.0178 $cm^2$/mJ for MS2 and T4, respectively. At 320 nm first-order fits ($R^2=0.74$ and $R^2=0.52$) yielded inactivation constants of 0.0058 and 0.0012 $cm^2$/mJ for MS2 and T4, respectively. Experiments at 330 nm and longer wavelengths did not show any measurable inactivation for MS2 and T4.

In examining these UV dose-response results for wavelengths from 254 to 310 nm, there was a reduction in inactivation constant as wavelength increased. An action spectrum, defined as the relationship between the inactivation constant and wavelength (Jagger, 1967), was also generated. For MS2 the inactivation constant reduces as wavelength increases, from 56.1 $cm^2$/J at 254 nm, 30.3 $cm^2$/J at 282 nm, 13.2 $cm^2$/J at 297 nm, 3.9 $cm^2$/J at 310 nm to 5.8 $cm^2$/J at 320 nm. The reversal from 310 nm to 320 nm was not expected. T4 has higher inactivation constants than MS2 in UVC and UVB, except at wavelengths around 320 nm. At 254 nm, T4 had inactivation constants of roughly 869.5 $cm^2$/J (Fallon et al., 2007), 653 $cm^2$/J at 282 nm (Winkler et al., 1962), 38.7 $cm^2$/J at 297 nm, 17.8 $cm^2$/J at 310 nm, and 1.2 $cm^2$/J at 320 nm.

Bacteria

The UV-dose response behavior of *E. coli* showed a lag in the lower doses, and tailing at higher doses, with a first-order slope in between. At 297 nm, the lag occurred below doses of roughly 10 mJ/$cm^2$, and tailing was observed at doses higher than roughly 100 mJ/$cm^2$. At 310 nm, the lag at lower doses extended to roughly 200 mJ/$cm^2$, with roughly log-linear behavior at doses above this value. At 320 nm the *E. coli* inactivation was minimal. At wavelengths longer than 320 nm no inactivation was observed for *E. coli*. An action spectrum for *E. coli* was also generated. Similar to viruses, the inactivation constant of *E. coli* reduces as wavelength increases. At 254 nm, *E. coli* O157 has an inactivation constant of 1341 $cm^2$/J which is higher than *Salmonella* and *Vibrio Chorela* inactivation constants of 444 $cm^2$/J and 642 $cm^2$/J, respectively. At 282 nm, *E. coli* I5 t-u-a has an inactivation constant of 1410 $cm^2$/J. At 297 nm and 310 nm,

*E. coli* ATCC 15597 has an inactivation constant of 88.3 cm$^2$/J and 20 cm$^2$/J, respectively. At 320 nm, *E. coli* 15 t-u-a has an inactivation constant of 0.14 cm$^2$/J and *E. coli* ATCC 15597 inactivation was negligible. However, the reduction in inactivation as the wavelength increases only occurs at wavelengths higher than roughly 260 nm (Wright and Cairns, 1998).

Discussion and Conclusions

The results from MS2, T4 and bacteria action spectra indicate that inactivation effectiveness decreased with increase in wavelength at wavelengths higher than 254 nm. Inactivation is minimal for wavelengths greater than 320 nm. The inactivation behavior observed in this study for bacteriophage and bacteria agree with the explanations given by Jagger (1981) that UV inactivation in UVB (290-320 nm) and UVC (below 290 nm) are thought to result from a similar path of dimerization of some DNA bases, while, the exposure to UVA (320-400 nm) causes sublethal effects such as growth delay, denaturing of proteins, and impaired membrane transport for bacteria. The lag and tailing observed in the dose-response curves at 297 nm and 310 nm for bacteria coincides with the findings reported in Pennell et al. (2008) and Blatchley et al. (2001) where it was hypothesized that tailing is caused by a subpopulation of microorganisms that may be resistant or shielded to UV when clumped together or shielded by particulate matter. It is hypothesized that the lag was caused by the fact that some microorganisms have to accumulate a threshold dose before they begin to be inactivated. The comparison with common pathogenic bacteria such as *Vibrio cholera, Salmonella* and *E. coli* O157 showed that they have similar behavior as *E. coli* ATCC 15597. This was illustrated by Wright and Cairns (1998) showing that bacteria have a peak inactivation around 260 nm which reduces as wavelength increases. This behavior is also linked to DNA absorption of UV with a peak around 254 nm and a reduction in absorption with increase in wavelength.

This wavelength-dependent behavior is relevant since previous solar disinfection studies (SODIS) characterized inactivation effectiveness using intensity and exposure time from a polychromatic solar radiation (280 nm-4000 nm) while effective radiation lies mainly in the UVB region of spectrum. In addition SODIS studies used PET bottles, which have poor transmittance below 320 nm, without taking into account wavelength-dependent transmittance.

Repair Of Bacteria During Solar UV Disinfection

In this disclosure, dark and light repair tests were conducted to check the potential for bacterial repair after UVB exposure. *E. coli* ATCC 11597 was used as it is known to have a higher repair potential compared to the majority of *E. coli* strains (Queck and Hu, 2008, a). Comparison with other studies on repair using low pressure mercury lamps (LP) and medium pressure lamps (MP) are also illustrated.

Materials and Methods

Microorganism

*E. coli* (ATCC 15597) was propagated on agar (TYE+15 g/L agar) in a Petri dish for 24 hours at 37° C. using the spread technique (Clesceri et al., 1998). Then, a colony was propagated in TYE broth to reach a log-growth phase and centrifuge-washed twice using sterile DI water to remove nutrient media. The bacteria were re-suspended in saline water (7% NaCl) before UV exposure. The initial concentration was between 10$^7$-10$^8$ CFU/mL. After exposure, three serial dilutions of *E. coli* samples were prepared in triplicate. *E. coli* were grown on agar in a Petri dish and enumeration was done by counting colony forming units (CFUs). The concentration in liquid phase was expressed in CFU/mL.

UV Exposure

The exposure to UV was similar to methods used for *E. coli* dose-response behavior. Samples were irradiated using a collimated beam device equipped with a narrow band filter with a peak at 297 nm, and sample solutions were completely stirred during exposure. For the first exposure, *E. coli* was subjected to a dose of 219 mJ/cm$^2$ and 5.8 log inactivation was measured. For the second exposure, *E. coli* was subjected a dose of 314 mJ/cm$^2$ and 6.06 log inactivation is achieved. These dose amounts were used to reach inactivation up to the tail level to test a hypothesis from the literature that suggests that repair may be eliminated beyond a threshold applied dose (Zimmer and Slawson, 2002). Repair associated with lower doses has been reported in other studies and will be used for comparison.

Light and Dark Repair Test

After UV irradiation, one batch of samples was exposed to radiation from an incandescent lamp (Sylvania, 60 W) as a source of repair light. The radiation spectrum for this lamp contains UVA and visible light, both of which are potentially important for photorepair. The output spectrum for this source was scanned using a spectrofluorometer (Horiba, FluoroLog®-3). Another batch of samples was tested for dark repair by covering with aluminum foil. These solutions were sampled every hour and viable *E. coli* concentration determined.

Results

When *E. coli* ATCC 15597 were exposed to 297 nm radiation with a dose of 219 mJ/cm$^2$, *E. coli* showed photorepair. They increased 0.5 log within one hour of photorepair, 1 log within two hours of photorepair, and roughly 2 log within three hours of photorepair. When the inactivation dose was increased to 314 mJ/cm$^2$, *E. coli* increased 0.2 log within two hours of photorepair, 0.5 log after four hours of photorepair, and 0.6 log after six hours of photorepair. No dark repair was observed when 297 nm was used.

In comparison to repair results observed by Queck and Hu (2008,b) and Zimmer and Slawson (2002), when LP and MP lamps are used, *E. coli* showed photorepair when exposed to radiation from LP and MP with inactivation doses lower than 60 mJ/cm$^2$. When *E. coli* ATCC 15597 was subjected to 20 mJ/cm$^2$ using a LP lamp, after one hour they increased 3.5 log, and after four hours they had an increase of roughly 4.4 log. For the same inactivation dose when a MP lamp was used *E. coli* increased 1.1 log after one hour and 2.6 log after four hours. When *E. coli* were subjected to an inactivation dose of 40 mJ/cm$^2$ using a LP lamp, the photorepair was less than when they were exposed to an inactivation dose of 20 mJ/cm$^2$. *E. coli* concentration increased to 1.1 log after one hour for both lamps and continued to increase up to 1.6 log and 2.6 for MP lamp and LP lamp, respectively. In general, *E. coli* exposed to LP lamp generated higher amount of photorepairs than when exposed to MP lamp.

When another strain of *E. coli* (*E. coli* ATCC 11229) was exposed to UV radiation using LP and MP lamps with doses of 5 and 10 mJ/cm$^2$, a small increase due to dark repair (roughly 0.1 log) was observed, but this figure is within the error range. Also, *E. coli* ATCC 11229 showed fewer repairs than *E. coli* ATCC 15597. The highest repair was a 2.8 log photorepair increase observed at dose of 10 mJ/cm$^2$ using LP lamp. There was minimal photorepair for this *E. coli* strain (ATCC 11229) when a MP was used.

Discussion and Conclusions

*E. coli* ATCC 15597 was used as surrogate to test repair after UV exposure since it is known to have higher repair than many bacteria, for instance the common pathogenic *E.*

*coli* O157. The amount of repair was found to be dependent mainly on the UV dose and wavelength that the microorganism was subjected to during inactivation. When 297 nm radiation was used, there was significant reduction in repair from roughly 2 log to 0.6 log when inactivation dose was increased from 214 mJ/cm$^2$ to 319 mJ/cm$^2$. When LP and MP lamps with doses above 60 mJ/cm$^2$ were used, no repair was observed. At doses where photorepair was observed, *E. coli* inactivated by MP lamp showed fewer repairs than LP lamp. The difference in repair between doses could be linked to the fact that higher doses cause higher damage and the bacteria has a limited number of enzymes used for repair. For instance, *E. coli* has 20 photolyases enzymes and each enzyme repairs 5 dimers per minute (Zimmer and Slawson, 2002).

The repair behavior showed a rapid increase in bacterial concentration followed by a constant or small increase in concentration with further exposure to reactivating radiation. In no case did the bacteria manage to achieve the initial concentration which implied that some damage is un-repairable or UV damages part of repair process. Also, photorepair appears to be more significant than dark repair.

Solar Radiation Estimation

There are two main ways solar radiation intensity data are obtained; they can be obtained from weather forecast agencies or be calculated using models. However, due to the complexity of the atmospheric system, solar radiation intensity estimates will typically have uncertainty associated with them. Another limitation is that in developing countries where the reactor that is the subject of this research will be used, there are few and inadequate weather stations due to limited means; this also reduces the accuracy and availability of solar spectral data. Several empirical models have been developed to estimate solar UV energy. Martin and Goswami (2005) and Jubran and et al. (2000) indicated that solar UV radiation (290 nm-400 nm) can be estimated from total solar radiation when atmospheric characteristics such as cloudiness index and air mass are known. The air mass represents the optical path length through the Earth's atmosphere and the cloudiness index is the ratio between diffuse and total radiation (Duffie and Beckman, 1991).

There are two components of total UV radiation. The first component is beam radiation, also known as direct radiation, which is the radiation received directly from the sun without any deviation. The second component is diffuse radiation, which is the radiation that reaches a collector after deviations attributed to different components in its path. These components may be clouds, aerosols, and Earth surface objects. Gueymard (1995) developed a model which predicts wavelength-dependent solar radiation. This model is useful to this study since it allows a wavelength-dependent inactivation study for the reactor.

Methods

Estimating Solar Radiation Using Simple Model for the Atmospheric Radiative Transfer of Sunshine (SMARTS) Model Gueymard (1995) developed the SMARTS model to simulate wavelength-dependent solar radiation. This model uses the extra-terrestrial solar radiation spectrum to compute a hemispherical solar radiation spectrum by taking into consideration the following atmospheric extinction processes: Rayleigh scattering, absorbance by ozone, uniformly mixed gases, water vapor, and nitrogen dioxide, and extinction due to aerosols.

The user input parameters to the SMARTS model include; site latitude, longitude, altitude, atmospheric pressure, precipitable water (cm), ozone vertical column (atm-cm), gaseous absorption and pollution, carbon dioxide, atmospheric turbidity, relative humidity, soil albedo, extra terrestrial spectrum, sun position and airmass. Gueymard (1995) indicated that since it is tedious to obtain all these atmospheric parameters, known vertical profile measurements of atmospheric parameters for ten specific reference sites are used to interpolate scheme data for other locations. These ten references used as standard atmospheres in the SMARTS are: Tropical (TPL, 15° North), Sub Tropical Summer (STS, 30° N), Sub Tropical Winter (STW, 30° N), Mid Latitude Summer (MLS, 45° N), Mid Latitude Winter (MLW, 45° N), Sub Arctic Summer (SAS, 60° N), and Sub Arctic Winter (SAW, 60° N), Arctic Summer (AS, 75° N), Arctic Winter (AW, 75° N), and US Standard Atmosphere (USSA, 45° N).

Thus, by specifying site latitude, longitude, altitude, time of day, day of year, and the corresponding reference atmosphere, the model generates atmospheric pressure, precipitable water, and ozone vertical column for the site and position of the sun in the sky. All of these parameters define the transmittance characteristics of the atmosphere.

For each site, the model categorizes gaseous absorbance and pollution as pristine, light, medium or severe pollution. The atmospheric turbidity caused by aerosols is classified using a coefficient TAU (optical depth at 500 nm), with values from 0.02-0.05 corresponding to an extremely clean atmosphere, 0.1 corresponding to a clear atmosphere, and 1 corresponding to a turbid atmosphere. This turbidity can also be specified as visibility (in kilometers). For example, a TAU=0.27 corresponds to roughly 25 km visibility. Almost all airports report visibility parameter for guidance of airplanes.

Eldoret, Kenya was selected as a representative location for modeling. This place is located in a region where solar radiation is abundant and there are not sufficient improved water treatment systems.

Eldoret, Kenya is located in a tropical area near the equator at a longitude of 0 degrees, 24 minutes and 16 seconds North and a latitude of 35 degrees, 14 minutes, and 20 seconds East. The altitude of the area varies between 2.1 and 2.7 kilometers above sea level. The time zone is universal time (GMT)+3 hours. The place has a town center and a rural part in the outskirts. The town is home to Moi University and Eldoret international airport. The climate is tropical with a mean annual rainfall between 995 and 1340 mm. The temperatures range from 10° C. to 37° C. throughout the year. The area has light soil, rich in organic matter and friable (Odongo and partners, 2010, Tessema et al., 2010). Eldoret has a population of around 250,000 people and its economy is dominated by tourism, agriculture and few industries.

The classification of inputs into the SMARTS model is in the form of "Cards" to classify input parameters, where each card represents a type of input parameter. The following are inputs used for Eldoret, Kenya:

Card1: Location: (0° 24' 16" N, 35° 14' 20" E)

Card2: Site pressure: 752.20 kilopascal, altitude: 2.7 km, instrument height: 0.001 m.

Card3: Reference atmosphere: Tropical (TPL).

Card4: Precipitable water in cm: "Calculate from reference atmosphere" selected.

Card5: Ozone vertical column (atm-cm): "Calculate from reference atmosphere" selected.

Card6: Gaseous absorption and pollution: "Calculate from reference atmosphere" selected.

Card7: CO2 in parts per million (ppm): a global average of around 370 ppm is used as default. 7a: Author Extraterrestrial spectrum used.

Card8: Aerosol model: Rural option selected.
Card9: Atmospheric turbidity: defaults Tau (500) 0.020 related to clean atmosphere is selected.
Card10: Type of soil: "light soil" selected.
Card 10b: Tilt angles: Radiation normal to surface selected.
Card11: Wavelength: 280 nm-400 nm
Card12: Output: Direct radiation
Card13: Receiver instrument: "Standard by pass" used as default
Card14, 15, 16: by passed: This is a function to smooth the output spectrum
Card 17: Specifies Year, Month, Day, Time, Latitude and Longitude Time Zone: For this card monthly variations were checked using 15th day of each month and diurnal variations from 8 am to 6 PM. The time zone of the location is (+3).

Cards 1, 2 and 3 describe location characteristics such as latitude, longitude, and altitude. These parameters were mentioned earlier in the previous paragraph. Cards 3 to 6 describe atmospheric optical density parameters such as ozone, precipitable-water and pollution gases. These parameters were set to be interpolated by SMARTS from tropical reference atmosphere. For card 7, $CO_2$ pollution levels for this location were difficult to obtain and a global average of 370 ppm was used (Azar and Schneider, 2002). Card 7a is the extraterrestrial intensity spectrum. The author-recommended spectrum was used. For card 8, which is a parameter related to land cover, a rural option was chosen to describe the area. Except the town center, the rest of the area is dominated by a rural part with farming activities (Tessema et al., 2010). Also, since the area has little industry activity and a wet weather the atmospheric turbidity is roughly clean (card 9). The rest of the cards describe the output required from SMARTS calculations such solar radiation measurement instrument setting, wavelength range, direct or diffuse radiation, Julian day, and time the solar radiation is to be determined.

To validate the SMARTS model simulation for Eldoret, total irradiance results were compared with solar irradiance data from SoDa (solar radiation data, http://www.sodais-.com), an organization that posts data derived from satellite (HelioClim-3). Monthly averaged insolation data from NASA surface meteorology and solar energy (http://eosweb.larc.nasa.gov/sse/) were also used as comparison to total irradiance from SMARTS model.

Since the prototype (which will be discussed later in the disclosure) was tested in West Lafayette Ind., solar radiation data for the prototype testing location were obtained from the UV-B monitoring network of Colorado State University (http://uvb.nrel.colostate.edu/UVB/uvb_dataaccess.jsf). The UV-B monitoring network of Colorado State University includes a network of monitoring stations, one of which is located at the Purdue University Agronomy Farm in West Lafayette, Ind. These data were also used to validate the SMARTS simulation for West Lafayette, Ind.

Results
Eldoret, Kenya.

The region between the tropics and the equator where Eldoret is located is characterized by small variations in solar radiation throughout the year. The results from the SMARTS model showed wavelength-related intensity variations with time. Solar radiation with wavelengths of 340 to 400 nm were observed at the highest intensity in February while below 340 nm the intensity was highest in October. The months of June and July had the lowest intensities at all UV wavelengths as. Monthly intensity variations increased with increases in wavelength. The accuracy of SMARTS intensity variation prediction is strongly dependent on the atmosphere turbidity; a substantial reduction in intensity occurred from a clear atmosphere (TAU 0.1) to a turbid atmosphere (TAU 1). An intensity reduction of around 80% for wavelengths 297 nm to 320 nm would occur if atmospheric turbidity deteriorated from clear (TAU 0.1) to turbid (TAU 1) conditions (~70 km to 5 km visibility), while an intensity reduction of around 13% would occur if the atmosphere turbidity changed from extremely clean to clear. This factor (TAU) affects monthly, daily and diurnal variations.

Predicted diurnal behavior demonstrated bell-shaped patterns for all months. Simulations were conducted for the 3 wavelengths of interest: 297, 310, 320 nm, which were where dose-response measurements were performed. From June to October the noon intensity for 297 nm had a 59% increase, a 16% increase at 310 nm, and 10.5% increase at 320 nm. The gap narrowed for other hours as you go down on both legs of the bell shape. Diurnal variations followed the visual path of the sun into the sky, which also creates a bell-shaped trajectory with a peak intensity when the sun is at Zenith (directly above on observer) which occurs at around noon. SMARTS solar radiation intensity was compared with SoDa data for Eldoret, Kenya, Jun. 15, 2005 and NASA 22 year average intensity for June. At noon, SMARTS and SoDa total radiation intensities were close: 990 $W/m^2$ and 987 $W/m^2$, respectively. Before noon SMARTS data were higher than SoDa data. For instance at 10 AM, SMARTS predicted intensity of 938 $W/m^2$ while SoDa intensity was 661 $W/m^2$. After noon, SoDa intensity was higher than SMARTS intensity. For example at 3 PM SoDa intensity was 901 $W/m^2$ while SMARTS intensity was 736 $W/m^2$. NASA 22 year average (1983-2005) for June was 730 $W/m^2$.

West Lafayette, Ind.

For West Lafayette, Ind., wavelength-dependent direct solar radiation intensities were also simulated using SMARTS and compared to wavelength-dependent intensities from UVB monitoring by Colorado State University (CSU). For 297 nm, the intensity has a bell-shaped curve from 10 AM to 3 PM (15 hr). For this wavelength the difference between SMARTS prediction and CSU data was small. Intensity from the CSU database was slightly higher than SMARTS-predicted intensity. For example at 1 PM (13 hr), SMARTS-predicted intensity was $5.36*10^{-4}$ $W/m^2$ while CSU-intensity was $5.51*10^{-4}$ $W/m_2$. The difference was slightly larger at 10 AM and 3 PM, SMARTS predicted intensity was $8.9*10^{-5}$ $W/m^2$ lower than CSU-intensity for both times.

For 310 nm, the CSU measurement of intensity was slightly higher than the SMARTS prediction. For example, the peak intensity (at 13 hr) was $5.41*10^{-2}$ $W/cm^2$ from SMARTS while CSU measured $6.01*10^{-2}$ $W/cm^2$. The daily average difference between these two predictions is around $5.9*10^{-3}$ $W/cm^2$. For 320 nm, the difference in intensity predicted by SMARTS and CSU was larger than at 297 nm and 310 nm. At 1 PM, SMARTS predicted $1.44*10^{-1}$ $W/cm^2$ while intensity from CSU was $2.21*10^{-1}$ $W/cm^2$. The daily average difference in intensity between the two predictions was $7.12*10^{-2}$ $W/m^2$.

Discussion and Conclusions

The SMARTS model can be used to provide estimates of the solar UV spectrum at locations for which measurements are generally not available, such as in developing countries. It is indicated by the authors of the model that their model results agree well with measurements at locations used for validation of the model and data from numerous studies.

SMARTS model solar radiation intensity data for Eldoret, Kenya and West Lafayette, Ind. were also comparable with data from weather organizations such as NASA, SoDa, and CSU UVB monitoring.

The SMARTS authors recommend the use of the weather parameters, when available, to get more accurate results from SMARTS than when standard values from reference atmospheres are used. In addition, it was noticed from SMARTS output results that unpredictable aerosols, for instance dusts blown up by wind, can be a source of uncertainty data for locations where the reactor may be used. The simulations at different aerosol conditions showed that the presence of aerosols causes reduction in solar UV radiation significantly.

Real time data for atmospheric parameters would increase the accuracy for predictions and local airports, when available, could be the first source for these parameters, especially for atmospheric turbidity which affect significantly solar UV received.

Solar UV Reactor Modeling

This section covers development of reactor geometry, intensity field simulation, determination of flow characteristics, dose distribution generation, reactor performance prediction, and lastly the reactor validation. Reactor geometry, size, and material properties were selected taking into consideration the prototype to be built, availability of materials and validation tests to be conducted.

Reactor Geometry Generation

The solar UV reactor in this disclosure comprised two major components; a Compound Parabolic Collector (CPC) for solar UV collection and a UV transmitting pipe with an inlet and outlet. The CPC collector was designed to collect solar radiation from the "aperture"; the top opening, and concentrate the solar radiation at the "receiver" where the pipe rests. The CPC profile is symmetric about its vertical centerline. The profile was generated using CPC equations (Equations 7.1 and 7.2) deduced from parabolic equations by Welford (1978). The second side is a mirror image of the first. The equations for the parabola are:

$$X = \frac{2f * \cos\theta}{(1 - \cos\theta)} \quad \text{Equation 7.1}$$

$$Y = \frac{2f * \sin\theta}{(1 - \cos\theta)} \quad \text{Equation 7.2}$$

Where

θ is the angle between a line joining the focus and a point on the parabola and the x axis.

f is the focus of the parabola,

X is the x direction of the parabola, and

Y is the y direction of the parabola.

Welford (1978) indicates that the focus (f) should be roughly equal to a quarter of the receiver (where radiation is focused) size. For the specific CPC that was the subject of many simulations in this research, f is 2.3 cm. The aperture's vertices calculated from Equations 7.1 and 7.2 are X=45 cm, Y=21 cm. When the mirror image side is added the aperture size equals 42 cm. A transparent teflon pipe of 5 cm internal diameter (ID) and a length of 120 cm was chosen as the water carrier. Two glass tubes (with 0.63 cm ID) were used as the inlet and outlet. The CPC which focuses radiation to the pipe extended in the Z direction along the length of the pipe. The reactor geometry, which includes the CPC and the pipe, was drawn using GAMBIT, a preprocessor for the computational fluid dynamics (CFD) software FLUENT (FLUENT Inc., Lebanon, N.H.). The geometry generated was meshed using TGRID mesh scheme in GAMBIT and exported to a CFD modeling software FLUENT. TGRID scheme creates a mesh that includes primarily tetrahedral elements, but may also contain hexahedral, pyramidal, and wedge mesh units (Gambit, FLUENT Inc., Lebanon, N.H.). For this reactor, Gambit generated 109,239 tetrahedral cells.

Intensity Field Generation

The propagation of radiation into the reactor was computed using the discrete ordinate model (DO) embedded in FLUENT SOFTWARE (Fluent 12.1.4 User Guide). The DO model uses the radiative transfer equation (RTE):

$$\nabla \cdot (I_\lambda(\vec{r}, \vec{s})\vec{s}) + (a_\lambda + \delta_s)I_\lambda(\vec{r}, \vec{s}) = a_\lambda n^2 I_{b\lambda} + \frac{\delta_s}{4\pi}\int_0^{4\pi} I_\lambda(\vec{r}, \vec{s}')\phi(\vec{s}, \vec{s}')d\Omega' \quad \text{Equation 7.3}$$

Where:

$\vec{r}$=position vector, $\vec{s}$=direction vector, $\vec{s}'$=scattering direction vector, s=path length, α=absorption coefficient, n=refractive index, $\delta_s$=scattering coefficient, δ=Steffan-Boltzmann coefficient (5.672*10$^{-8}$ W/m$^2$-K$^4$), I=radiation intensity, which depends on position ($\vec{r}$) and direction ($\vec{s}$), T=local temperature, φ=phase function, and Ω'=solid angle.

Previous studies have indicated good prediction of reactor performance when the DO model was used to simulate the intensity field in UV reactors (Ho, 2009; and Santoro et al., 2010).

The DO model can be combined with a solar irradiance model, which uses the latitude and longitude of the location where the system is applied (Eldoret, Kenya), to determine the orientation of the system with respect to solar beam direction. As a starting point for inputs to FLUENT, the Eldoret solar radiation spectrum simulated using the SMARTS model was used. Solar radiation at 10 AM on June 15$^{th}$ was used as the lower-bound radiation intensity to investigate inactivation, this month has the lowest UVB in a year for this location. Solar radiation at noon on October 15$^{th}$ was used to investigate peak inactivation since this month has the highest UVB for Eldoret. The radiation propagation simulation was done for 297 nm, 310 nm and 320 nm wavelengths.

Aluminum foil was chosen as the CPC wall surface cover and treated as a reflective wall. An experiment to test aluminum reflectance was conducted and will be covered later in this chapter Aluminum reflectance test showed that 35.3%, 38%, and 45% of radiation to be specularly reflected for 297 nm, 310 nm and 320 nm respectively. The rest of the reflection was assumed to be diffuse. The refractive indices for aluminum are 0.25, 0.28 and 0.3 for 297 nm, 310 nm, and 320 nm respectively (Rakic, 1995).

The radiation absorbance for the pipe, made from FEP Teflon, a low-cost plastic to be used for the prototype pipe was determined using a spectrometer (Varian, Cary 300 BIO). The measured absorbance coefficients were 0.025, 0.018 and 0.015 for 297 nm, 310 nm, and 320 nm respectively. The transmittance of water used was also measured using the spectrophotometer and 97.5%, 98.2%, and 98.5% of radiation is transmitted for 297 nm, 310 nm, and 320 nm, respectively.

Results

In general the intensity distribution inside the CPC showed an increasing pattern from aperture to the receiver as were observed in intensity contours for the transversal and longitudinal cross-sections. At 297 nm for June 15$^{th}$ radiation, from the aperture to the receiver the intensity varied from roughly $4.5*10^{-4}$ W/cm$^2$ to around $3.08*10^{-3}$ W/cm$^2$. Looking at the longitudinal cross-section, the two extremities receive lower intensity than the mid-length part. Maximum intensity at the ends of the CPC was $1.5*10^{-3}$ W/cm$^2$, while mid-length location received roughly $3.08*10^{-3}$ W/cm$^2$. The CPC theoretical intensity concentration, which is the ratio between aperture and receiver sizes, should be equal to 4.6 for this case. For the simulation the concentration ratio for a small section on receiver that received the highest radiation reached around 6.9, 7 and 7.3, for 297 nm, 310 nm, and 320 nm respectively. The difference between the middle-part intensity and the extremities, with the middle part getting higher concentration ratio than theoretical and the extremities getting lower than the theoretical, may be because the middle-part receives radiation reflected from two sides of the CPC, while the edge receives radiation reflected from one side. In addition, solar radiation rays that are not perpendicular to the aperture and imperfections on CPC might contribute to this non-uniform distribution of intensity. An ideal geometry would be created if the number of vertices used to draw the parabolic curve approaches infinity.

Similarly, at 310 nm and 320 nm the intensity distribution in the reactor increased from aperture to receiver. A summary of simulated radiation intensity from aperture to receiver for 297, 310 and 320 nm at June 15$^{th}$, 10 AM and October 15$^{th}$, noon is presented in Table 7.1.

trajectory (Equation 7.4) to allow estimation of the dose the particle accumulated along its path.

Another approach to model UV reactor is the Euler-Euler approach whereby the UV reactor system is treated as a tracer in a chemical reactor. This latter approach uses the advection-diffusion equation with an inactivation kinetic term to determine the performance of the reactor. When the two approaches are compared to bioassay tests, the Euler-Lagrange approach has been reported to predict well inactivation for a continuous flow UV reactor (Munoz et al., 2007).

The DPM was applied based on the following conditions. First the amount of water to be treated per day was estimated. It is estimated that a healthy person will drink about 2 liters of water per day (EPA, 2000). Thus, for a sub-Saharan African family which average about 6-8 persons (Caldwell, 1968), at least 16 liters (0.016 m$^3$) are required to be disinfected. Since the sunshine is not present 24 hours, a six hour effective sunshine was chosen as period of treating the 16 liters. The maximum Reynolds's number for this reactor is 0.426 at 80° F. (for a 44 mL/min flow rate), which indicates a laminar flow type. To mimic microorganisms, a target of a thousand particles (1-1.2 µm each) was numerically injected into the reactor. This number of particles yielded repeatable results for inactivation prediction in previous studies (Naunovic, 2006; Lim, 2010). In addition, due to the small size of microorganisms in the laminar flow field, Brownian motion of particles was also taken into account.

$$\text{Dose} = \int_0^\tau I * t \, dt \qquad \text{Equation 7.4}$$

Where:
I is intensity, and
τ is the residence time.

Reactor Performance

The performance of the reactor, which is expressed by the ratio of the concentration of viable microorganisms after disinfection (N) and initial microbial concentration (N$_o$),

TABLE 7.1

Summary of comparison between radiation intensity at receiver and aperture from DO model.

| Wavelength (nm) | June 15$^{th}$ at 10 AM, Intensity (W/m$^2$) | | | October 15$^{th}$ at noon, Intensity (W/m$^2$) | | |
|---|---|---|---|---|---|---|
| | Aperture | Receiver-high | Receiver-Extremity | Aperture | Receiver-high | Receiver-Extremity |
| 297 | $4.46 * 10^{-4}$ | $3.08 * 10^{-3}$ | $1.5 * 10^{-3}$ | $3.25 * 10^{-3}$ | $2.24 * 10^{-2}$ | $1 * 10^{-2}$ |
| 310 | 0.068 | 0.475 | 0.2 | 0.124 | 0.869 | 0.391 |
| 320 | 0.217 | 1.58 | 0.7 | 0.321 | 2.33 | 1.17 |

Reactor Fluid Mechanics and Disinfection Prediction
Discrete Particle Model (DPM) and Dose Determination In this disclosure microorganisms flowing into the reactor were modeled using a discrete phase (particle) model (DPM) embedded in the FLUENT software. First, FLUENT solved mass and momentum conservation equations numerically and a velocity field in the reactor was generated. Then, particle trajectories in the domain were determined using particle momentum. Forces acting on the particle include discrete phase inertia, hydrodynamic drag, and force of gravity. The particle can also be tracked using stochastic methods (random walk) when turbulence is involved. The approach that generates simulated particle paths is named the Euler-Lagrange approach (FLUENT user's guide 2006). Then, the radiation intensity field was mapped to the particle was calculated by integrating the dose distribution with the dose-response behavior for each particle using the Segregated Flow model (Equation 7.5).

$$\frac{N}{N_0} = \int_0^\infty \left(\frac{N}{N_0}\right) BR * E(D) \, d(D) \qquad \text{Equation 7.5}$$

Where:

$\frac{N}{N_0}$ is the survival ratio, i.e., the ratio between viable microorganisms leaving and entering the reactor, $$\left(\frac{N}{N_0}\right)BR$$

is the survival ratio observed in a bench scale batch reactor, and

E(D)d(D) is the fraction of microorganisms that received a dose D.

The performance was determined at each wavelength and the overall performed was calculated using summation of responses at each wavelength, as suggested by Wright (2000), Sutherland (2002) and Giese and Darby (2000).

Results

Dose Distribution

The dose-distribution for particles irradiated with the incident solar intensity for June 15th, 10 AM and October 15th noon radiation for 297, 310 and 320 nm wavelengths follow roughly a normal or log-normal distribution. These dose distribution characteristics ($D_{10}$, $D_{50}$, and $D_{90}$) are summarized in Table 7.2 and Table 7.3. $D_{10}$ signifies that "10% of particles received a dose less than or equal to", $D_{50}$ signifies that "50% of particles received a dose less than or equal to" (i.e., median dose), $D_{90}$ signifies that "90% of particles received a dose less than or equal to".

For 297 nm on June 15th, 10 AM, $D_{10}$, $D_{50}$ and $D_{90}$ were 0.55 mJ/cm², 0.74 mJ/cm² and 1.28 mJ/cm² respectively. The difference in $D_{10}$, $D_{50}$ and $D_{90}$ indicates the particles received heterogeneous doses, some particles received low doses and others received high doses. These differences are attributable to differences in intensity history among particle trajectories and differences in exposure time. These trajectories depend on many factors, that include; radial velocity profile, with low velocity at the wall of the pipe due to friction, sudden enlargement; the small inlet tube (0.63 cm ID) discharged in larger tube (5 cm ID) and sudden contraction at the outlet. Some studies reported recirculation, mixing, and particle dispersion and deposition due to sudden expansion and sudden contraction in pipe flow (Durst et al., 1974 and Guo et al., 2001). Thus, particles that are caught in recirculation receive higher doses than particles taking a straight path, for instance, at the center of the pipe where the velocity is high and the intensity is low. Also, if dose characteristics are compared with residence time distribution characteristics for a tracer in a reactor such Morrill index, which states that the ratio between $t_{90}$ (time 90% of tracer came out) and $t_{10}$ (time 10% of tracer came out) less than 2 indicates a plug flow (velocity constant at any cross-section), (Tembhurkar and Mhaisalkar, 2006). This reactor flow was not plug as the ratio between $D_{90}$ and $D_{10}$ varied between 2.2 and 2.6.

On October 15th noon, the dose delivered increased significantly for 297 nm wavelength. $D_{10}$, $D_{50}$ and $D_{90}$ were 4.15 mJ/cm², 5.53 mJ/cm² and 9.4 mJ/cm² respectively. For 310 nm on June 15th, 10 AM, $D_{10}$, $D_{50}$ and $D_{90}$ were 70 mJ/cm², 116 mJ/cm², 174 mJ/cm² respectively. On October 15th noon the dose accumulated by particles almost doubled compared to June 15th. $D_{10}$, $D_{50}$ and $D_{90}$ were 162 mJ/cm², 202 mJ/cm², and 365 mJ/cm² respectively. For 320 nm on June 15th, 10 AM, $D_{10}$, $D_{50}$ and $D_{90}$ were 247 mJ/cm², 370 mJ/cm², and 637 mJ/cm² respectively. While on October 15th, noon, $D_{10}$, $D_{50}$, and $D_{90}$ were 407 mJ/cm², 551 mJ/cm², and 903 mJ/cm² respectively.

TABLE 7.2

Dose distribution characteristics for June 15th, 10 AM.
10 AM-Dose Distribution (mJ/cm²)

| Wavelength (nm) | $D_{10}$ | $D_{50}$ | $D_{90}$ |
|---|---|---|---|
| 297 | 0.55 | 0.74 | 1.28 |
| 310 | 70 | 116 | 174 |
| 320 | 247 | 370 | 637 |

TABLE 7.3

Dose distribution characteristics for October 15th, noon.
Noon-Dose Distribution (mJ/cm²)

| Wavelength (nm) | $D_{10}$ | $D_{50}$ | $D_{90}$ |
|---|---|---|---|
| 297 | 4.15 | 5.53 | 9.4 |
| 310 | 162 | 202 | 365 |
| 320 | 407 | 551 | 903 |

Inactivation

Figure 4:
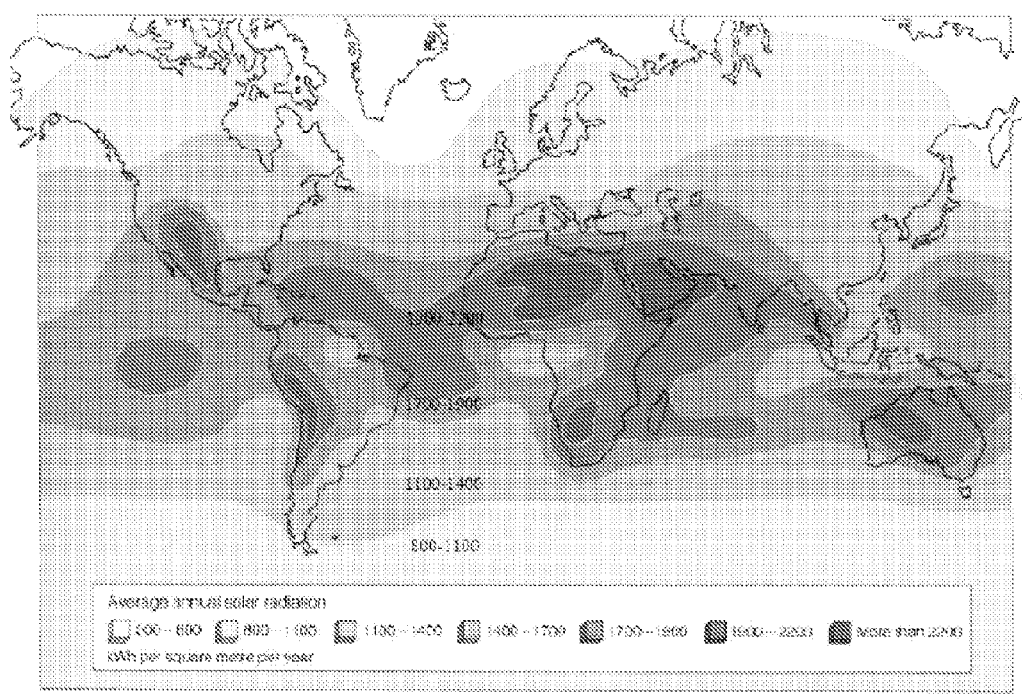
FIG. 4 is a world map showing world solar radiation.
Figure 5:
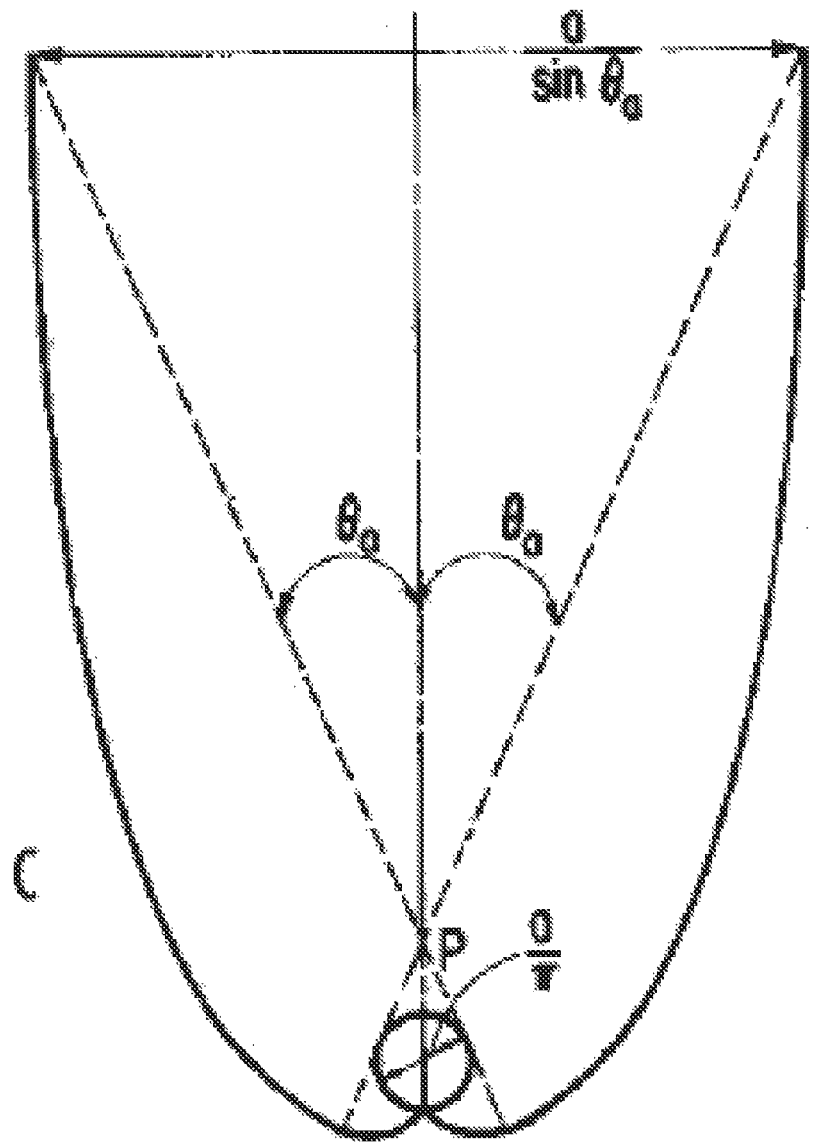
FIG. 5 is a schematic illustration of a Compound Parabolic Concentrator (CPC) with a tubular receiver.

The Inactivation results for June 15th, 10 AM and October 15th, noon for MS2 and T4 are summarized in Table 7.4. MS2 disinfection showed a 0.006, 0.256, and 1.159 log reduction at 297, 310 and 320 nm, respectively when June 15th 10 AM radiation was considered. When October 15th noon radiation was considered, a 0.017, 1.102, and 0.257 log reduction was achieved. For T4, inactivation reached a 0.12, 3.26, 0.79 log reduction at 297, 310 and 320 nm, respectively. The aggregate inactivation for these 3 wavelengths was between 1.42 and 2.15 log for MS2 and between 1.38 and 2.41 log inactivation for T4. If this simulation case is compared with comparison with conventional treatment required MS2 inactivation dose of 40 mJ/cm² (λ=254 nm), which yields 2.2 log MS2 inactivation (1.7-2.8 log: EPA bounds, FIG. 4.5), inactivation was lower than required at 10 AM and in the required range at noon.

TABLE 7.4

Summary of MS2 and T4 inactivation (log units).

| Wavelength (nm) | Using June 15th at 10 AM radiation | | Using October 15th at noon radiation | |
|---|---|---|---|---|
| | MS2 | T4 | MS2 | T4 |
| 297 | −0.006 | −0.017 | −0.042 | −0.124 |
| 310 | −0.256 | −1.102 | −0.465 | −1.909 |
| 320 | −1.159 | −0.257 | −1.647 | −0.376 |
| Total | −1.42 | −1.38 | −2.15 | −2.41 |

Validation of Model

Building a Prototype

Figure 8:
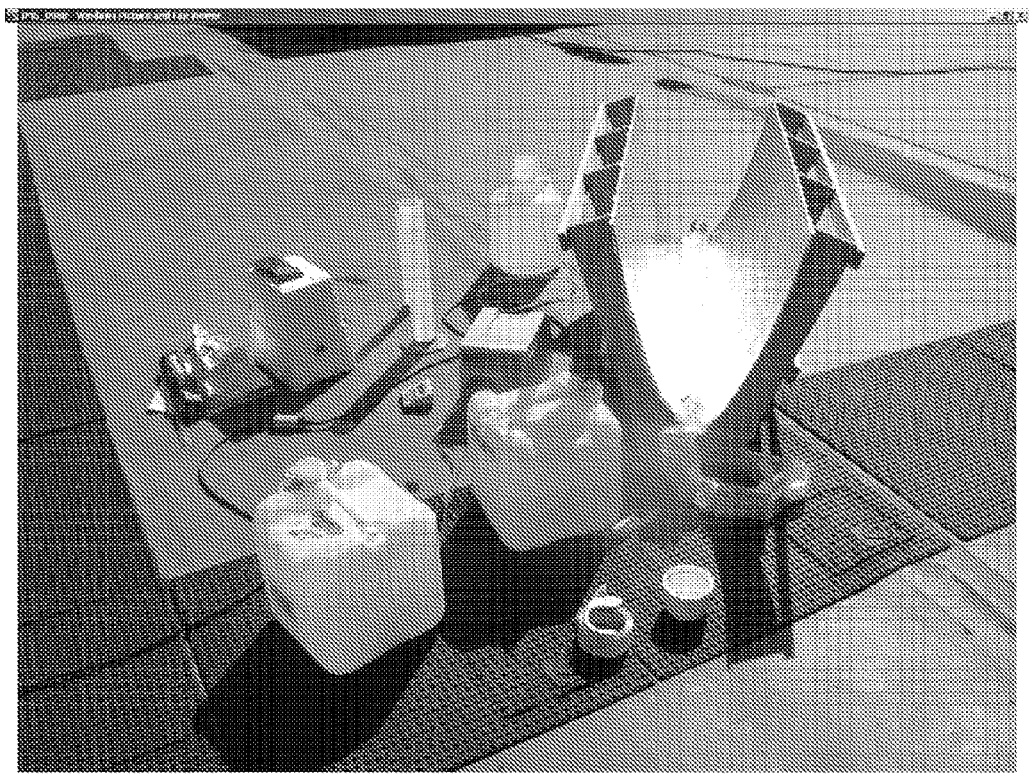
FIG. 8 is a picture of a prototype according to an embodiment of the present disclosure.
Figure 9:
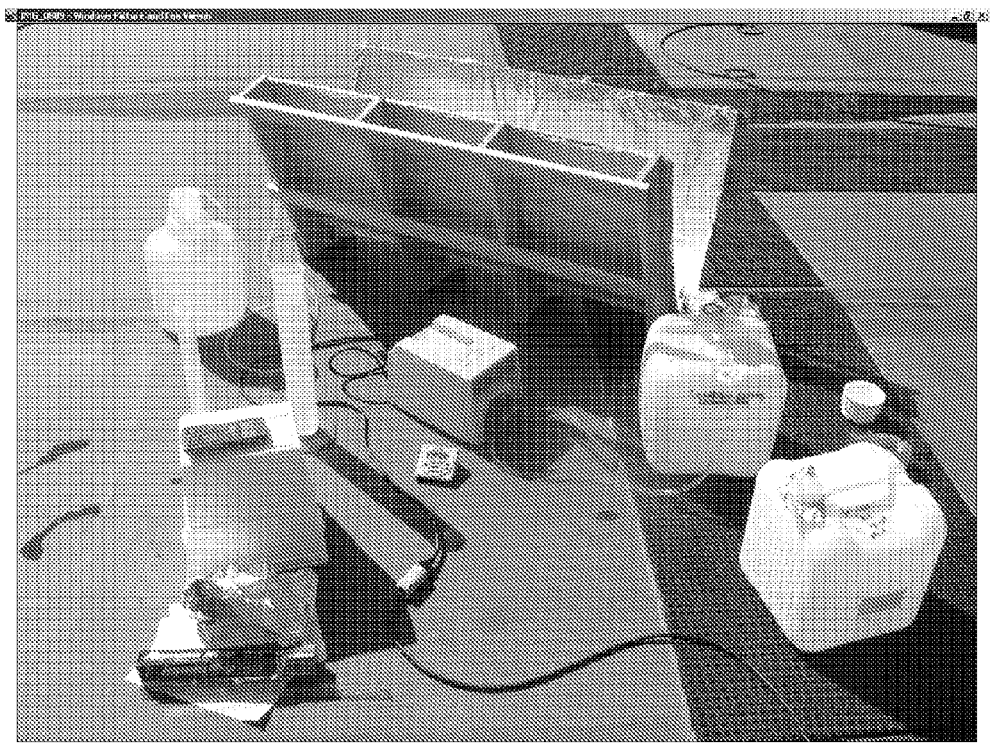
FIG. 9 is another picture of the prototype of FIG. 8.

The CPC was built from Paulownia lumber. This wood is lightweight (240 to 304 kg/m³), is categorized among the strongest woods in terms of strength against rupture (399 kg/cm²) and has good stability against humidity and drying (www.paulowniawood.com). The CPC was constructed with a 42 cm aperture, 9.2 cm receiver and it is 128 cm long. The surface of the CPC was covered with Aluminum foil (from Reynolds consumer products) using double sided tape. A 5 cm internal diameter (ID), 120 cm long Teflon tube (made from DuPont FEP Teflon resins) was used as the reactor pipe. A 0.65 cm ID Master Flex plastic tube and a 0.63 cm ID glass tube were used to connect water tanks with the Teflon pipe. Two plastic containers (HDPE) were used for water storage at the inlet and outlet of the reactor. To be able to keep a constant flow, a peristaltic pump (Master Flex: model 7518-60) was used. It is envisioned that a non-electric fluid flow system could be utilized. There are methods to deliver water, at a constant flow rate, without electricity. Any system that will deliver a constant, controlled flow rate to the reactor will work. For example, it is possible to implement constant-head tanks on the upstream and downstream ends of the system as a means of controlling flow rate. These tanks could be set up without electricity. Time was measured using a stopwatch. Digital images of the reactor setup are depicted in FIGS. 8 and 9.

Prototype Testing; Procedure and Conditions

Before the experiment the water conduits were sterilized with chlorine solution (5 mg/L) for five hours and chlorine flushed with sterile water for two hours. The experiment was conducted on the roof of the Civil Engineering Building, Purdue University to minimize building obstructions. A suspension (45 mL) of MS2 bacteriophage (roughly $1\text{-}2*10^{11}$ PFU/mL) was injected into an inlet tank that contained 11.5 liters of sterile de-ionized water and mixed thoroughly. The initial phage concentration was roughly $6\text{-}8*10^{8}$ PFU/mL. Water was transferred from the inlet tank to the reactor through a 0.65 cm ID line using a peristaltic pump. The pump was switched on at 10:30 AM (July $16^{th}$, 2010). The flow rate was maintained at 44 mL/min, and samples were collected at the outlet pipe at 0, 1, 2, 3, and 4 hours respectively. The air temperature at the receiver of the CPC and water temperature were also recorded. MS2 was detected using double agar method (described in Bacteriophage analysis detection using plaque essay method).

Prototype Testing; Results

Figure 10:
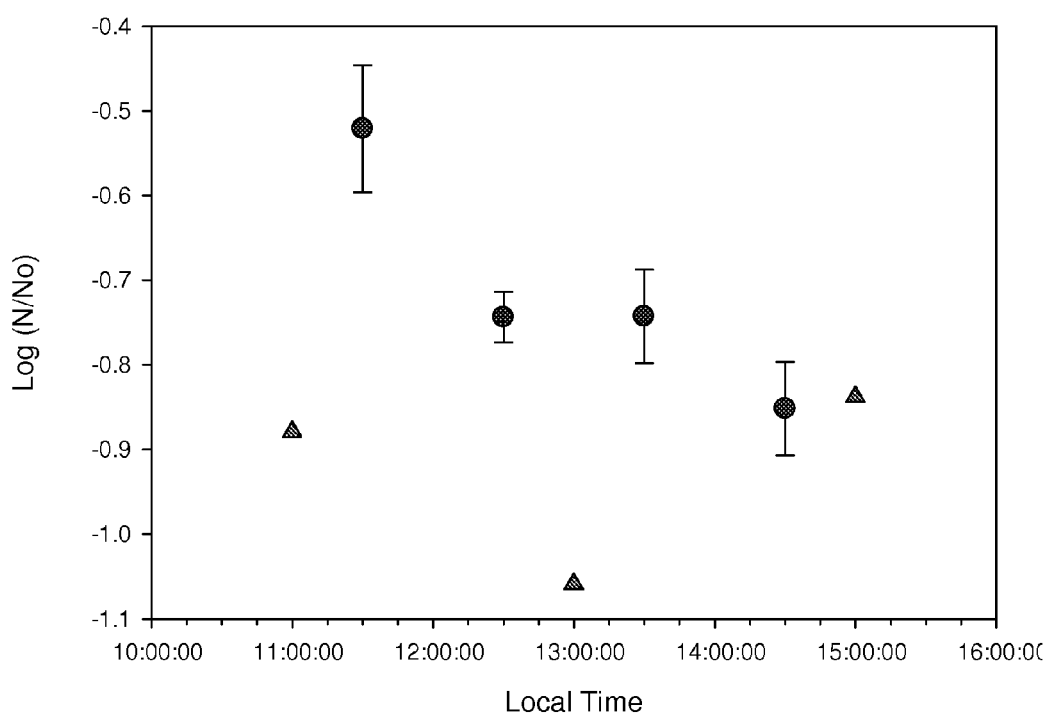
FIG. 10 is a graph illustrating MS2 inactivation based on prototype testing. Prototype results are illustrated as (•) and Vs simulation results are illustrated as (▲), error bars: 95% Confidence Interval.

The pump was started at 10:30 AM. At 10:30 AM no infective MS2 were detected at the outlet pipe. Sterile water present in the pipe at the beginning of the experiment was still being pushed out. For a sample taken after one hour, infective MS2 were detected. The mean residence time in the pipe was roughly 0.9 hour. The inactivation results showed an increase in microbial inactivation between the 11:30 sample and the 12:30 sample, from 0.52 to 0.74 log inactivation. After 2 hours the inactivation trend stabilized (see FIG. 10), the inactivation remained at 0.74 log between 12:30 and 13:30. Then, inactivation increased slightly to 0.85 log for the 14:30 sample.

Solar radiation is reported (UVB monitoring by CSU) at 1 hour interval. After the start of the pump solar radiation was recorded at 11:00, at the peak radiation 13:00, and at 15:00 for all wavelength. The MS2 inactivation simulation was done for 11:00 radiation, peak radiation at 13:00, and radiation at 15:00 to compare with prototype inactivation of MS2. The simulated inactivation ranged between 0.88 log for 11:00, 1.06 log for 13:00 and 0.84 log for 15:00 as shown on FIG. 10. The variation in inactivation between 11:00, 13:00 and 15:00 was roughly between 0.18 to 0.2 log. This small variation might mainly be attributed to a small variation in radiation intensity observed between 11:00 and 15:00 for 320 nm wavelength. MS2 inactivation caused by 320 nm was roughly 80% of total inactivation. 310 nm caused roughly 19% of total inactivation and 297 nm caused roughly less than 1% of total inactivation. This is because the intensity at 320 nm was between 200 and 600 times higher than the intensity at 297 nm and roughly 3 times higher than 310 nm. It can be argued that the 0.85 log MS2 inactivation achieved by the prototype and simulated 0.84-1.06 log were more or less in agreement. Simulated inactivation was slightly higher than prototype inactivation possibly because of errors when building the prototype, such as, deformations on the reflective surface, the CPC, and FEP pipe, and errors during testing the prototype. Also, another limitation to accurately predict inactivation using simulation is lack of uncertainty information associated with solar radiation prediction given by SMARTS and UVB monitoring by CSU.

The air temperature at the receiver reached 83° C. and 65° C. at 12:30 and 14:30, respectively, and the temperature of water remained between 36° C. and 39° C. Thus, the inactivation recorded is only linked to UV inactivation since temperature would have an effect only for temperatures above 50° C. (Berney et al., 2006).

Prototype; Computer Simulation

The simulation process requires information on solar radiation and material properties. Solar radiation data were obtained from real time UV-B monitoring, Colorado State University for the West Lafayette site and compared with data simulated with SMARTS model (see chapter 6).

Figure 11:
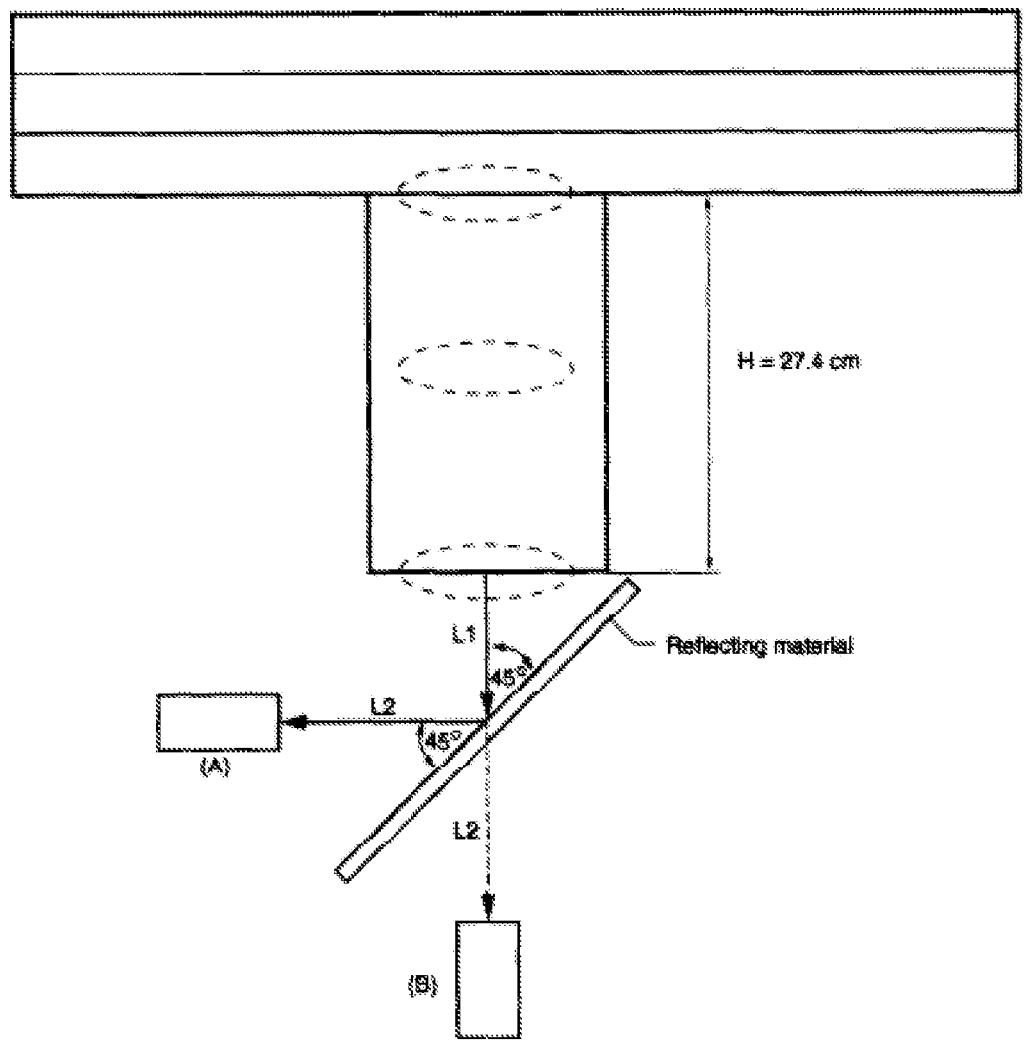
FIG. 11 is a picture of an experimental aluminum reflectance test set up.
Figure 12:
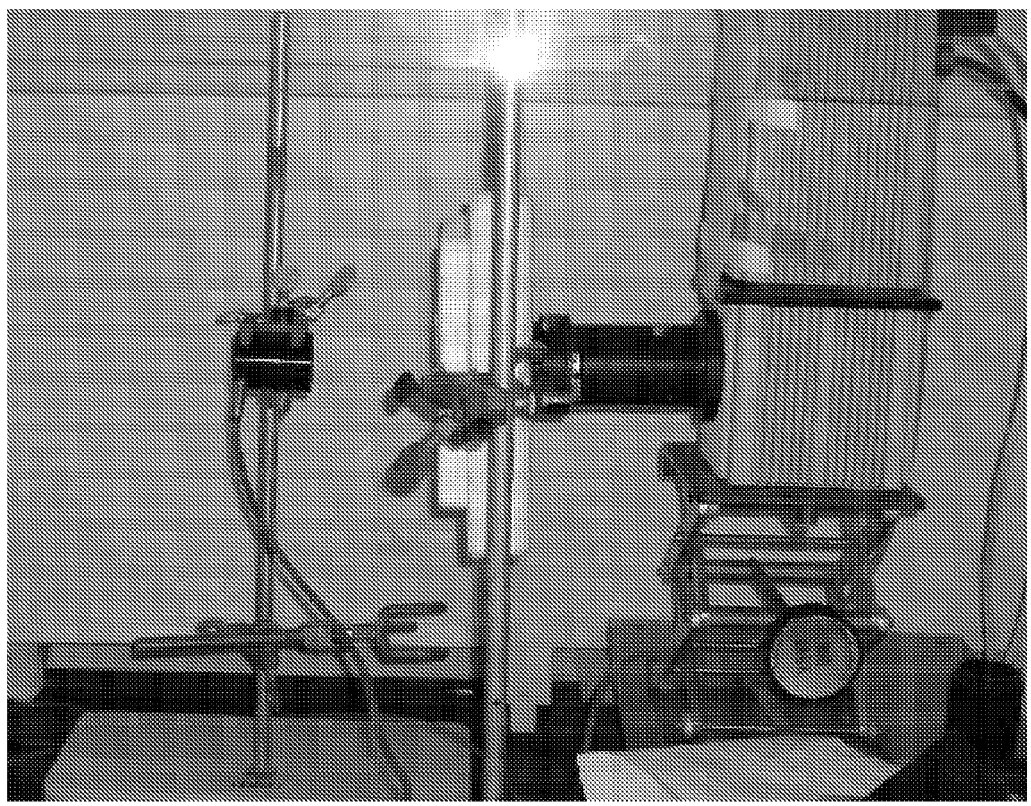
FIG. 12 is a picture of a horizontal light detection test set up.

Regarding the material properties the transmittance of the Teflon pipe was measured using UV-Visible spectrometer (Varian, Cary 300 BIO). The transmittance ranged from 43 to 51% between 297 nm and 320 nm. The reflectance of aluminum foil was also measured using the ORIEL instrument and a radiometer (discussed in Solar Radiation Estimation) as follows. First, a beam of radiation was detected horizontally, and then it was detected vertically after being 45° reflected by a surface covered with aluminum foil. The ratio between radiation detected vertically and radiation detected horizontally is the reflectance of the aluminum foil. Optical filters were used to isolate 297, 310 and 320 nm wavelengths. The reflectance of the aluminum foil obtained was 35%, 38% and 45% for 297, 310 and 320 nm, respectively. A digital image of this experimental setup is shown in FIGS. 11 and 12. The transmittance of water used for the MS2 suspension was measure as 97.5%, 98.2%, and 98.5% for 297 nm, 310 nm, and 320 nm, respectively. The computation of intensity field and dose distribution was done using FLUENT as described in Intensity Field Generation, Reactor Fluid Mechanics and Disinfection Prediction, and Discrete Particle Model (DPM) and dose determination.

Results

Intensity Field

The intensity field results show that the radiation was concentrated at the receiver as described in Intensity Field Generation. Similar to intensity fields observed in Intensity Field Generation, the intensity increased from aperture (light blue color) to the receiver (reddish color). When the irradiation at the aperture is compared with the most irradiated spot at the receiver the intensity multiplication factor ranged between 6 and 7.5 for 297, 310, and 320 nm. However, the intensity was not uniform along the pipe. The CPC ends received lower intensity than the mid-length. As mentioned in Intensity Field Generation, this may be because the middle-part receives radiation reflected from two sides of the CPC, while the edge receives radiation reflected from one side. In addition, solar radiation rays that are not perpendicular to the aperture and imperfections on CPC geometry might contribute to this non-uniform distribution of intensity.

Dose Distribution

Dose distributions were obtained using similar methods as in Reactor Fluid Mechanics and Disinfection Prediction. Dose distribution characteristics ($D_{10}$, $D_{50}$, and $D_{90}$) are summarized in Tables 7.6 and 7.7. Similar to results observed in Solar UV Reactor Modeling, particle received heterogeneous doses as shown $D_{10}$ and $D_{90}$ in Table 7.6 and 7.7. Several factors could contribute to this behavior as mentioned earlier; for instance, mixing, recirculation, and particle diffusion and deposition, caused by sudden expansion and contraction of the pipe and radial velocity profile.

Inactivation

The wavelength-dependent MS2 inactivation values are presented in Table 7.5. The MS2 inactivation varied between 0.004 log and 0.007 log for 297 nm, 0.153 log and 0.215 log for 310 nm, and 0.681 log and 0.837 log for 320 nm. These values show that the inactivation was more significant for 320 and 310 nm than at 297 nm. Even though the MS2 inactivation rate is higher for 297 nm ($k=0.0132$ cm$_2$/mJ) compared to 310 nm ($k=0.0039$ cm$_2$/mJ) and 320 nm ($k=0.0058$ cm$_2$/mJ), the intensity is roughly 100-200 times and 200-600 times higher for 310 nm and 320 nm, respectively than at 297 nm. The aggregate inactivation simulation inactivation varied from 0.88 log, 1.06 log to 0.84 log for 11 AM, 1 PM and 3 PM simulations, respectively. The prototype test results showed a 0.85 log inactivation which was more or less in agreement with the simulation results between 0.84 log and 1.06 log inactivation. As mentioned above, the small difference in inactivation between simulation and real test might be attributable to limitation of accurately estimating solar radiation, differences in drawn and built reactor geometry, difference in simulated flow and flow in the prototype, and any limitations or error during testing.

TABLE 7.5

Prototype wavelength-dependent log inactivation.

| Wavelength (nm) | Log Inactivation | | |
|---|---|---|---|
| | 11 AM | 1 PM | 3 PM |
| 297 | −0.004 | −0.007 | −0.004 |
| 310 | −0.165 | −0.215 | −0.153 |
| 320 | −0.709 | −0.837 | −0.681 |
| Total | −0.879 | −1.059 | −0.838 |

TABLE 7.6

Dose distribution characteristics for West Lafayette, Indiana, July 16$^{th}$, 11 AM.
11 AM-Dose Distribution (mJ/cm$^2$)

| Wavelength (nm) | $D_{10}$ | $D_{50}$ | $D_{90}$ |
|---|---|---|---|
| 297 | 0.36 | 0.74 | 1.1 |
| 310 | 71 | 103 | 130 |
| 320 | 254 | 310 | 360 |

TABLE 7.7

Dose distribution characteristics for West Lafayette, Indiana, July 16$^{th}$, 1 PM.
1 PM-Dose Distribution (mJ/cm$^2$)

| Wavelength (nm) | $D_{10}$ | $D_{50}$ | $D_{90}$ |
|---|---|---|---|
| 297 | 0.68 | 1.28 | 1.63 |
| 310 | 102 | 132 | 184 |
| 320 | 300 | 365 | 432 |

TABLE 7.8

Dose distribution characteristics for West Lafayette, Indiana, July 16$^{th}$, 3 PM.
3 PM-Dose Distribution (mJ/cm$^2$)

| Wavelength (nm) | $D_{10}$ | $D_{50}$ | $D_{90}$ |
|---|---|---|---|
| 297 | 0.33 | 0.74 | 0.94 |
| 310 | 75 | 92 | 103 |
| 320 | 250 | 290 | 332 |

Inactivation of Other Microorganisms

The dose-distributions simulated for this reactor can be used to predict inactivation capabilities of this reactor relative to other microorganisms. However, wavelength-dependent inactivation constants for a wide range of microorganisms in the UVB range are rare. Also, inactivation constants could differ depending upon the band-width used during dose-response behavior study. In this study, inactivation kinetics were determined using band-width (10 nm wide at half-height) with peaks at 297 nm, 310 nm and 320 nm and the total inactivation was calculated by summation of wavelength-dependent inactivation over these band-widths. Gill and McLoughlin (2009) compiled relative resistance to sunlight UV for common microorganisms found in drinking water or used in UV disinfection studies. On their graph, inactivation constants of various microorganisms were normalized against the *E. coli* inactivation constant. The graph shows that microorganisms such as *B. subtilis, Enterococcis* and *A. polyphaga* are relatively more resistant to sunlight UV than *E. coli* and MS2. Other microorganisms such as *Salmonella* and *Shigella* are less resistant to sunlight UV than *E. coli* and MS2. However, these data were compared from different studies and they did not mention the spectral comparisons for sunlight used.

Reactor Modeling; Discussion and Conclusions

The UV intensity input to the reactor design is a crucial parameter since there is a limited control on it. The atmosphere is a complex system that affects the exact predictions of this parameter. The intensity variations in space and time made it challenging to design a UV system applicable to all areas where it is needed. Thus, a modeling procedure was generated, in which variables such as geometry dimensions and flow rate can be varied to meet a treatment goal for a location. Eldoret (Kenya) radiation was chosen as starting point. The wavelength-dependent intensity generated from SMARTS model show that the month of June has the lowest incident 297, 310 and 320 nm radiation. The month of October showed highest incident radiation from these three wavelengths. The geometry and mesh generated using Gambit permitted generation of intensity field for the three wavelengths and a DPM model was used to predict the performance of the simulated reactor. A prototype to validate the model was built using Paulownia lumber covered with aluminum foil as reflective surface and FEP Teflon pipe transmitted the radiation concentrated by the CPC to the flow of water. This prototype was tested in West Lafayette, Ind. on July 16$^{th}$ and measured inactivation response of coliphage MS2 which provided results similar to model predictions. Specifically, the prototype test results showed a 0.85 log (+0.05) inactivation which is more or less in agreement with the simulation results between 0.84 log and 1.06 log inactivation.

This method can be applied where it is possible to simulate solar radiation. For this reactor size, the reactor did not meet MS2 inactivation between 1.7 log and 2.8 log related to 40 mJ/cm$_2$ ($\lambda=254$ nm) required for conventional UV treatment when June 15th, 10 AM radiation is used but it was achieved with October 15th, noon, when water is treated at a flow rate of 44 mL/min for Eldoret. Thus, dimensions could be changed to meet this standard. The CPC performance can be improved by increasing aperture to receiver ratio or increasing the length. For example if the reactor simulated in this disclosure is doubled in length a proportional doubling in log inactivation is expected for microorganisms that display first-order dose-response behavior. Also, inactivation can vary depending upon the availability of materials, solar radiation and amount of water to be treated. For instance, FEP Teflon used on this study had low transmittance, thus, the choice of a more UV transparent material would increase performance. Aluminum foil used here has low UV reflectance and improvement by using a more reflective surface would increase the inactivation performance. Also, the reduction of flow rate would allow increase in inactivation.

Additional Testing Disclosure

Reflective Material Testing

Three reflective materials that were patented by Dow Company were examined in these experiments (now sold by Dunmore Corporation): 200 DUN-CHROME PET/VDAL, the 50 DUN-CHROME CRC/AL/PET, and the 50 DUN-MET AL/PET/AL. These metalized plastic materials are inexpensive, light in weight, and can resist harsh environmental stresses, making them potential candidates for solar disinfection applications. Samples of these metalized plastic films, along with aluminum foil, were measured for reflectance on both sides.

A collimated medium pressure mercury lamp was used for the reflectance measurements. This UV source was chosen because of the polychromatic nature of its radiation output. The lamp was housed in a wooden enclosure to minimize sample and operator exposure to uncontrolled radiation. Forced air circulation and water cooling served to help the lamp thermally equilibrate, thereby stabilizing the output of electromagnetic radiation from this source. A flat-plate collimator, constructed from wooden plates with apertures aligned vertically and directed at the axis of the lamp was used to condition lamp output, thereby promoting uniformity of exposure and allowing output radiation from the lamp to be directed to the target (Blatchley, 1997). Collimated radiation from the medium pressure lamp was then passed through one of three narrow bandpass optical filters (diameter=4.92 cm). The filters used in this study were characterized by peak transmittance at 297, 310, and 320 nm; each filter was characterized by a bandwidth of approximately 10 nm (half-height)

A radiometer was first placed at location B, and the intensity for the wavelength of interest was recorded. L1 and L2 were both 10.2 cm, making B 20.4 cm from the filter. The material of interest was then placed at a 45° angle relative to the incident radiation from the collimated source. The radiometer was then placed at location A, and the value recorded. Reflectance was calculated by the ratio of the intensity measurement at location A to the intensity measurement at location B, with a value of 1 representing a material that perfectly reflects all of the incident radiation.

Disinfection Efficacy Testing

The CPC used was constructed from Paulownia lumber, a lightweight wood that is extremely resistant to rupture, humidity, and drying. The CPC had a 42 cm aperture, a 9.2 cm receiver, and was 125 cm in length. The interior surface was covered with aluminum foil which was secured to the CPC surface with double sided tape. A quartz tube with an internal diameter of 2.25 cm and a length of 127 cm served as the reactor pipe. Two rubber stoppers fitted with a thin copper tube served to connect the ends the reactor tube to plastic tubing running to water storage containers that held influent/effluent water. The influent container was glass covered with aluminum foil to prevent any premature disinfection. The effluent container was plastic (HDPE), but samples were taken directly from the outlet tube before they reached the container. A peristaltic pump was used maintain a constant flow rate of 9 mL/min through the reactor, yielding a mean residence time within the reactor of 54.5 minutes. Digital images of the setup can be found below in FIGS. 13, 14 and 15. The flow rate was selected based upon the study performed by Mbonimpa (2010), which suggested that a residence time of approximately 0.9 hours was appropriate for the geometry that defined this prototype CPC.

An aqueous suspension of the challenge organism was prepared by isolating and culturing $E.$ $coli$ from a water sample that was collected from the Wabash River near West Lafayette, Ind. The water sample was collected from the river and membrane filtration (EPA 2002) was performed. Membrane filters from this test were placed in Petri dishes containing Whatman MI Broth as a growth medium, then incubated at 35° C. for 24 hours. A flame sterilized loop was used to collect a colony of $E.$ $coli$ from one of these Petri dishes and then used to inoculate 100 mL of a feed broth (concentration=8 grams broth powder per liter of de-ionized water) that had been boiled prior to use. The inoculated broth was then placed on a shake table and incubated at 35° C. for 5-7 hours, until the optical density as measured by a spectrophotometer at 600 nm reached 0.4510. Membrane filtration was performed upon dilutions of the solution, which yielded concentrations of $2-4*10^8$ CFU/mL.

Prior to experimentation, all water conduits were sterilized with an aqueous solution containing 6 mg/L of free chlorine for 2 hours and then flushed for 4 hours with de-ionized water that had been sterilized in an autoclave.

The experiment was performed on the roof of the Civil Engineering Building on the Purdue University campus in order to minimize building obstructions. The inlet tank contained 7.5 liters of a sterilized carbonate buffer, prepared using 100 mg/L of sodium bicarbonate and de-ionized water. The buffer solution had a slightly alkaline pH, ranging from 7.65 to 8.1. Into this buffer, 750 µL of the suspension of $E.$ $coli$ described above (roughly $3*10^8$ CFU/mL) was injected and mixed thoroughly. The resulting feed concentration of bacteria was approximately $3*10^4$ CFU/mL.

Figure 13:
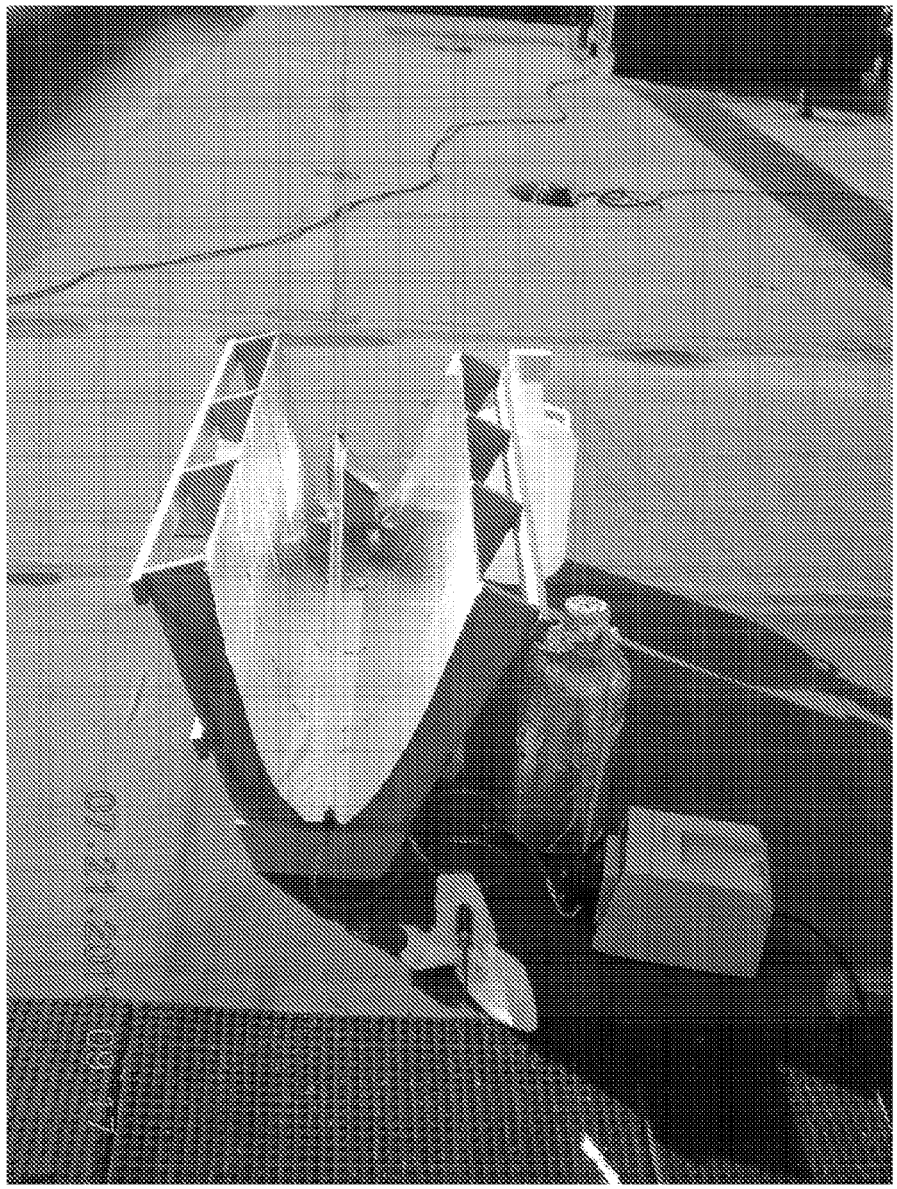
FIG. 13 is a picture of a prototype according to an embodiment of the present disclosure. In this picture, the effluent end of the tub was raised to allow exclusion of air bubbles during the filling process.
Figure 14:
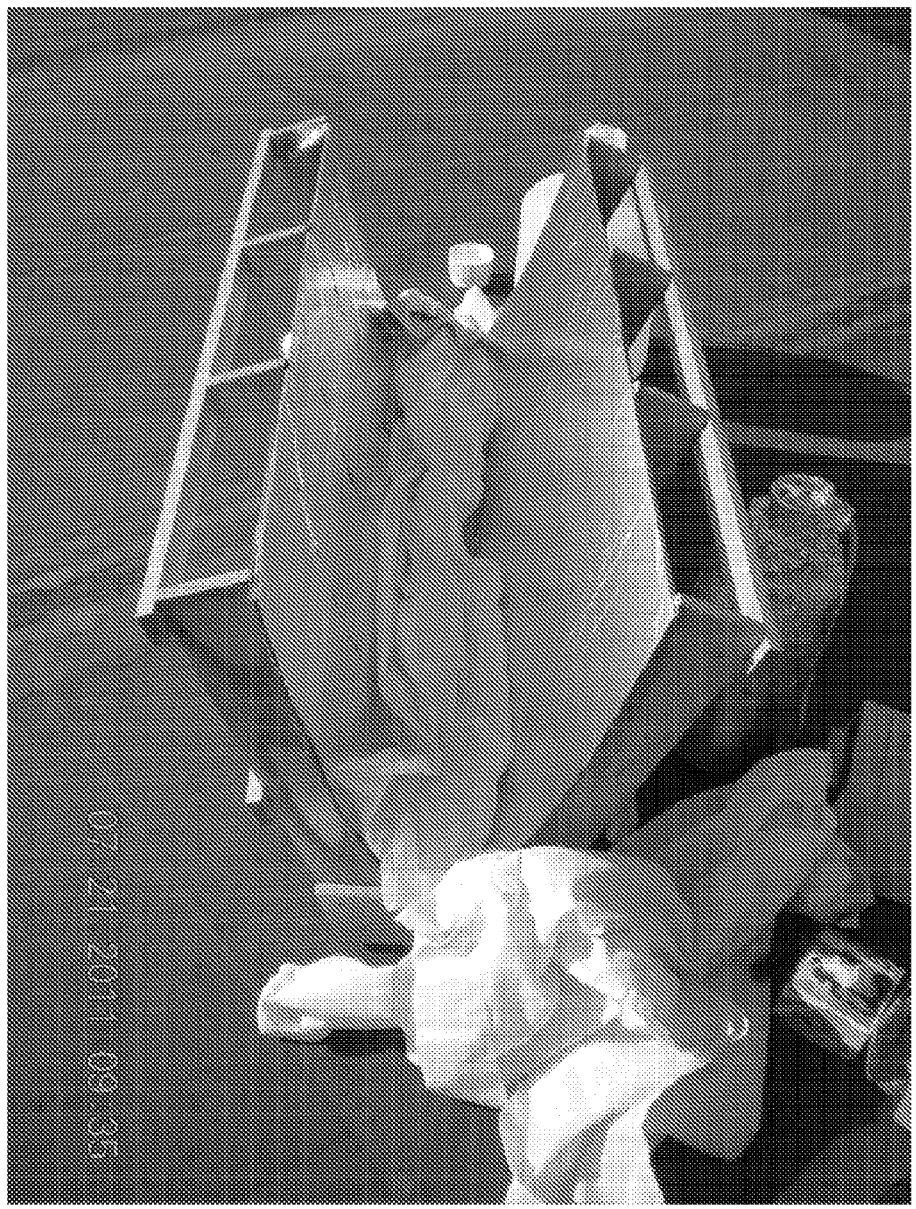
FIG. 14 is another picture of the prototype of FIG. 13. In this picture, the quartz tube was covered during the first hour of flow to purge the reactor.
Figure 15:
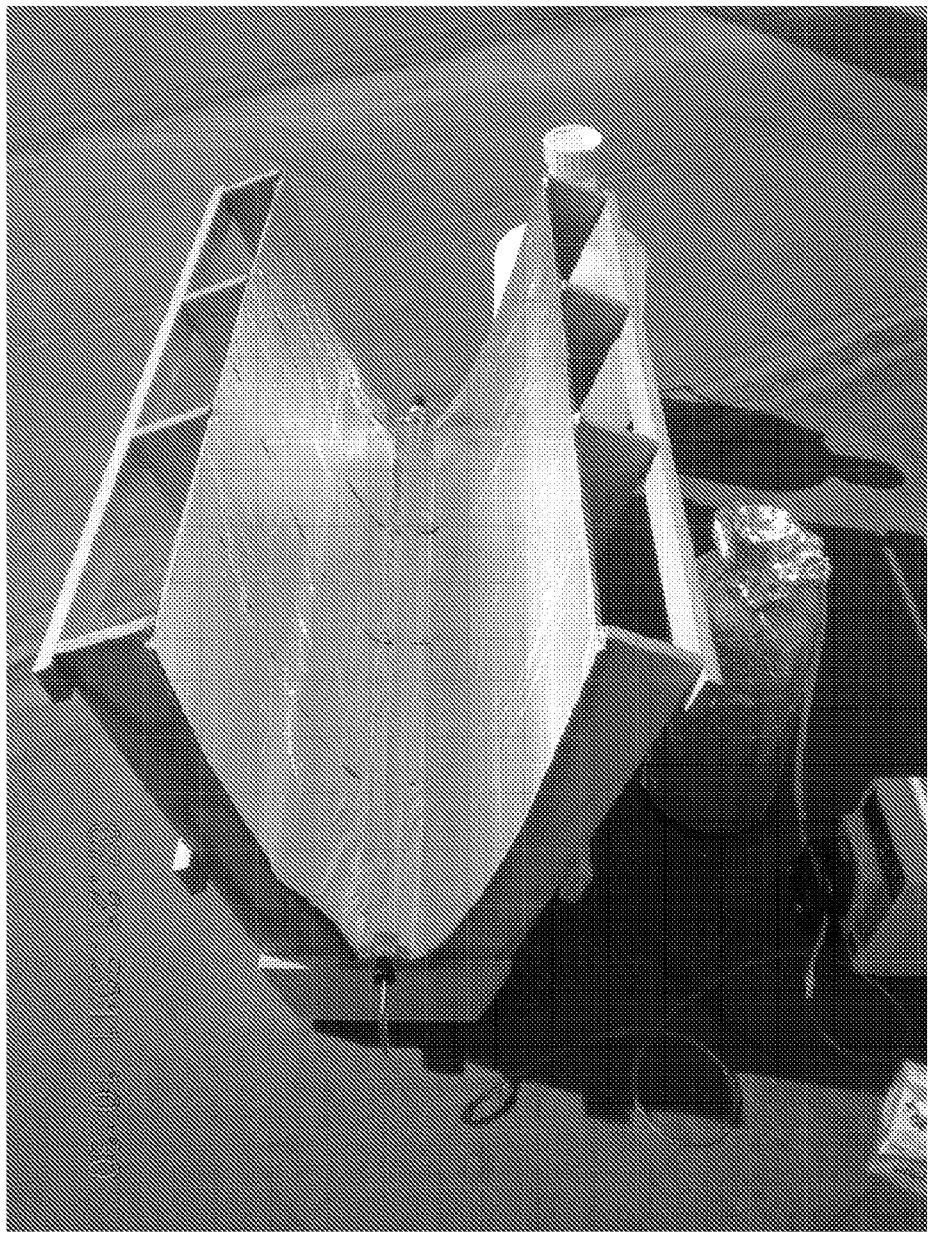
FIG. 15 is another picture of the prototype of FIG. 13 during normal operation according to an embodiment of the present disclosure.

The pump was turned on at 9:00 A.M. with a flow rate of 44 mL/min. As shown in FIG. 13, the effluent end of the reactor tube was propped up at the beginning of the experiment to allow the reactor tube to fill completely, without inclusion of air bubbles. Filling of the reactor tube was completed by 9:20 A.M. At this time, the prop was removed, and the quartz tube was secured into place using small metal brackets. The flow rate was adjusted to 9 mL/min and the reactor tube was covered with cotton sheets, as shown in FIG. 14, until the 10:00 A.M. sample was taken. The cover was removed after the 10:00 A.M. sample, which was used to test whether or not disinfection occurred without UV exposure. The feed was sampled at 10:00 A.M., 1:00 P.M., and 4:00 P.M.; the effluent was sampled in 1 hour intervals starting at 10:00 A.M. and ending at 4:00 P.M.

20 mL of each sample was collected in sterilized glass beakers. The feed samples were extracted from the feed reservoir with a sterile pipette. Samples were then diluted to varying concentrations using dilution tubes. Membrane filtration was performed on the diluted samples, as described above.

Cloud cover was estimated in okta[1] at the time of each sample, but actual irradiance measurements were obtained from the UV-B Monitoring and Research Program website http://uvb.nrel.colostate.edu/UVB/index.jsf (NREL 2011). This monitoring program is sponsored by the United States Department of Agriculture data collection program headquartered at Colorado State University, and includes a network of monitoring stations, one of which is located at the Purdue University Agronomy Farm in West Lafayette, Ind.

[1] An okta is a unit of measurement used to describe cloud cover. Sky conditions are estimated in terms of how many eighths of the sky are obscured by cloud, ranging from completely clear, 0 oktas, through to completely overcast, 8 oktas.

Results

Reflective Material Testing

Figure 16:
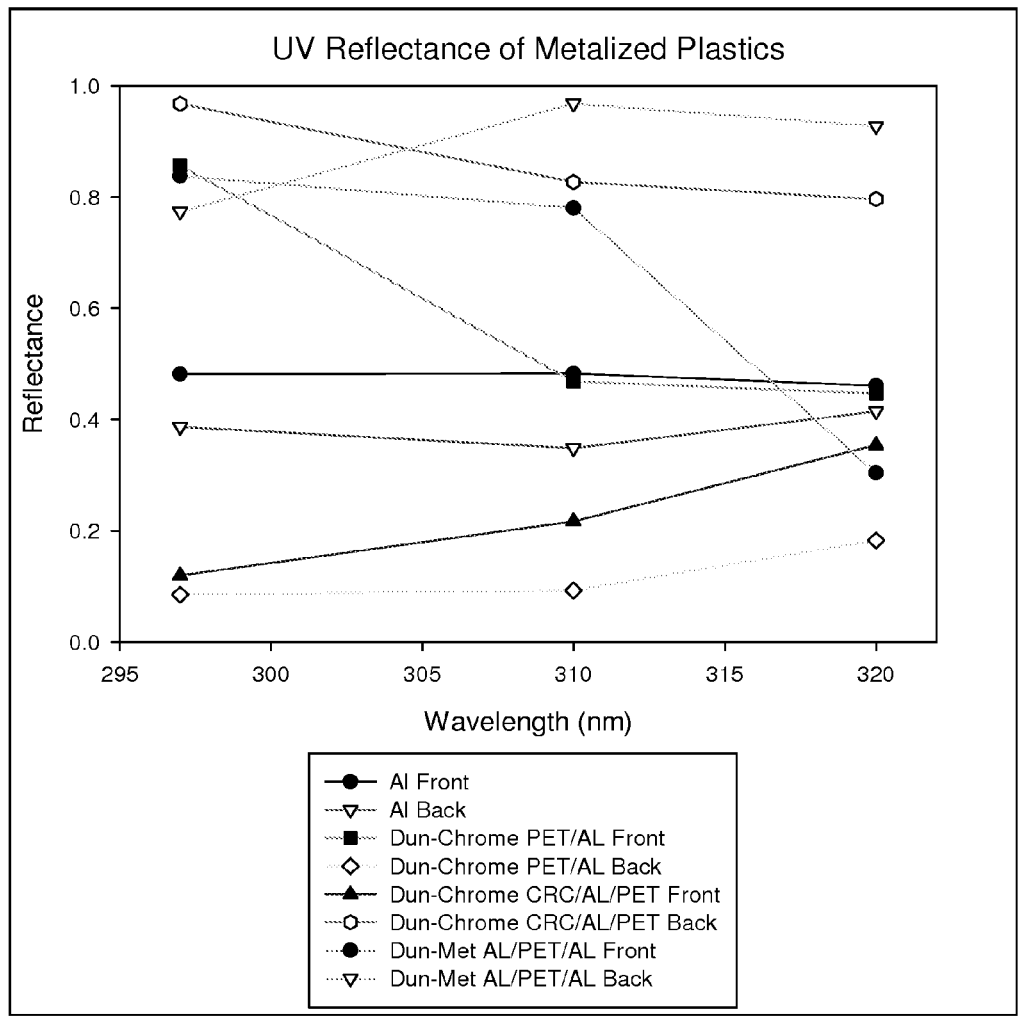
FIG. 16 is a graph illustrating reflectance of metal films and metalized plastics as a function of wavelength.

Results of reflectance measurements for the four materials that were tested are summarized in Table 1 and FIG. 16. These data indicate that all three of the metalized plastic samples reflected the wavelengths of interest as well or better than aluminum foil. While the reflectance of aluminum foil was between 46 and 49%, the films identified as "50 Dun-Chrome CRC/AL/PET" and "50 Dun-Met AL/PET/AL," reflected solar UV radiation substantially more effectively, with reflectance measurements greater than 80%. These results suggest that the performance of solar disinfection reactors could be enhanced by substitution of metalized plastics for aluminum foil on the CPC. Additionally, CRC is a corrosion resistant material that protects the surface of the aluminum, which serves as the reflecting material. The corrosion resistance would be very desirable in the implementation of the CPC.

TABLE 1

Material reflectance data.

| Material | Side | Wavelength | No Reflection | Reflection | % Reflectance |
|---|---|---|---|---|---|
| Aluminum | Front | 297 | 3.270E−05 | 1.575E−05 | 48.17% |
| | | 310 | 3.960E−05 | 1.912E−05 | 48.28% |
| | | 320 | 1.434E−06 | 6.610E−07 | 46.09% |
| | Back | 297 | 3.270E−05 | 1.265E−05 | 38.69% |
| | | 310 | 4.030E−05 | 1.405E−05 | 34.86% |
| | | 320 | 1.550E−06 | 6.430E−07 | 41.48% |
| 200 Dun-Chrome PET/VDAL | Front | 297 | 3.280E−05 | 2.810E−05 | 85.67% |
| | | 310 | 4.020E−05 | 1.883E−05 | 46.84% |
| | | 320 | 1.560E−06 | 6.970E−07 | 44.68% |
| | Back | 297 | 3.150E−05 | 2.680E−06 | 8.51% |
| | | 310 | 3.770E−05 | 3.500E−06 | 9.28% |
| | | 320 | 1.499E−06 | 2.740E−07 | 18.28% |
| 50 Dun-Chrome CRC/AL/PET | Front | 297 | 3.180E−05 | 3.800E−06 | 11.95% |
| | | 310 | 3.840E−05 | 8.330E−06 | 21.69% |
| | | 320 | 1.502E−06 | 5.320E−07 | 35.42% |
| | Back | 297 | 3.080E−05 | 2.980E−05 | 96.75% |
| | | 310 | 3.760E−05 | 3.110E−05 | 82.71% |
| | | 320 | 1.511E−06 | 1.203E−06 | 79.62% |
| 50 Dun-Met AL/PET/AL | Front | 297 | 3.080E−05 | 2.580E−05 | 83.77% |
| | | 310 | 3.730E−05 | 2.910E−05 | 78.02% |
| | | 320 | 1.517E−06 | 4.610E−07 | 30.39% |
| | Back | 297 | 3.090E−05 | 2.390E−05 | 77.35% |
| | | 310 | 3.720E−05 | 3.600E−05 | 96.77% |
| | | 320 | 1.494E−06 | 1.386E−06 | 92.77% |

Disinfection Efficacy Testing

In order to quantify disinfection efficacy, delivered dose was calculated from the data collected by the UV-B Monitoring and Research Program instrument in West Lafayette, Ind. Readings for the wavelengths of 300, 305, 311, 317, and 325 nm were taken every three minutes during daylight hours. Sharp dips in the signals of irradiance measurements were observed throughout the day. The dips are attributable to clouds passing between the instrument and the sun. It should also be noted that the behavior for each wavelength was similar, with the main difference being the respective magnitudes of radiation intensity: higher intensities are recorded for longer wavelengths.

The applied dose at each wavelength was calculated as the integral of measured intensity over the residence time (approximately 1 hour) for each sample taken from the reactor.

$$\text{Dose} = \int_0^\tau I(t)\,dt$$

For example, the 300 nm dose calculated for the 11:00 A.M. sample was based on intensity measurement data from 10:00 A.M. to 10:57 A.M. The reactor was assumed to behave as a plug flow system for these calculations. Since germicidal effectiveness decreases at longer wavelengths, the overall applied dose was weighted using the DNA absorbance spectrum. Weighting functions were developed at each wavelength by dividing absorbance at that wavelength by the absorbance at 300 nm. Dose was then multiplied by the corresponding weighting function and added to get a single weighted dose for each sample.

Figure 17:
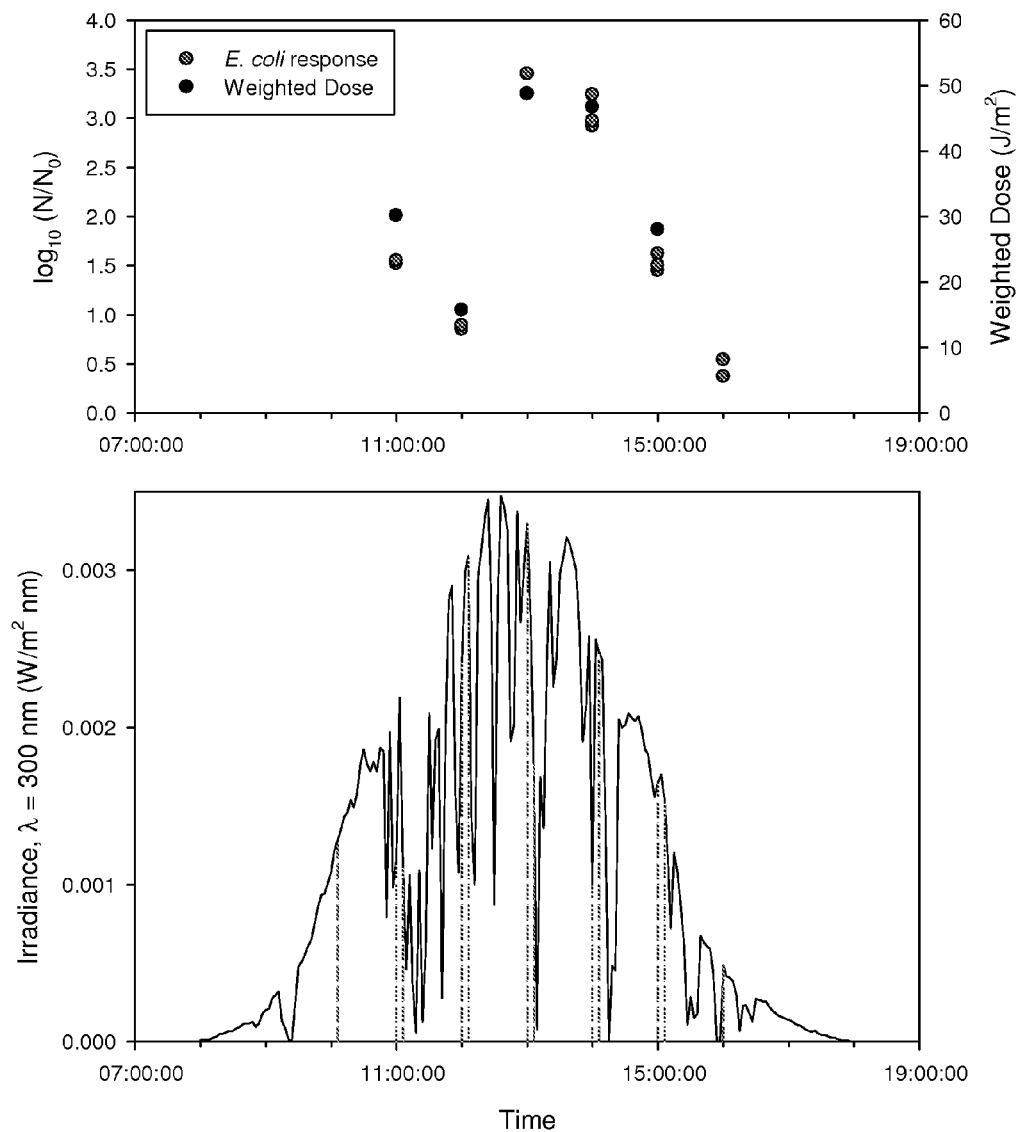
FIG. 17 is a graph illustrating disinfection efficacy and weighted dose as functions of time on Jul. 26, 2011 and West Lafayette observed intensity at 300 nm as a function of time on Jul. 26, 2011.

FIG. 17 illustrates the observed inactivation responses, corresponding applied/weighted UV doses, and the time-dependent solar UV intensity (at λ=300 nm). The weighted dose clearly correlated with cloud cover, as observed by the UV-B collection instrument, and in turn, disinfection efficacy was strongly dependent on weighted dose.

Figure 18:
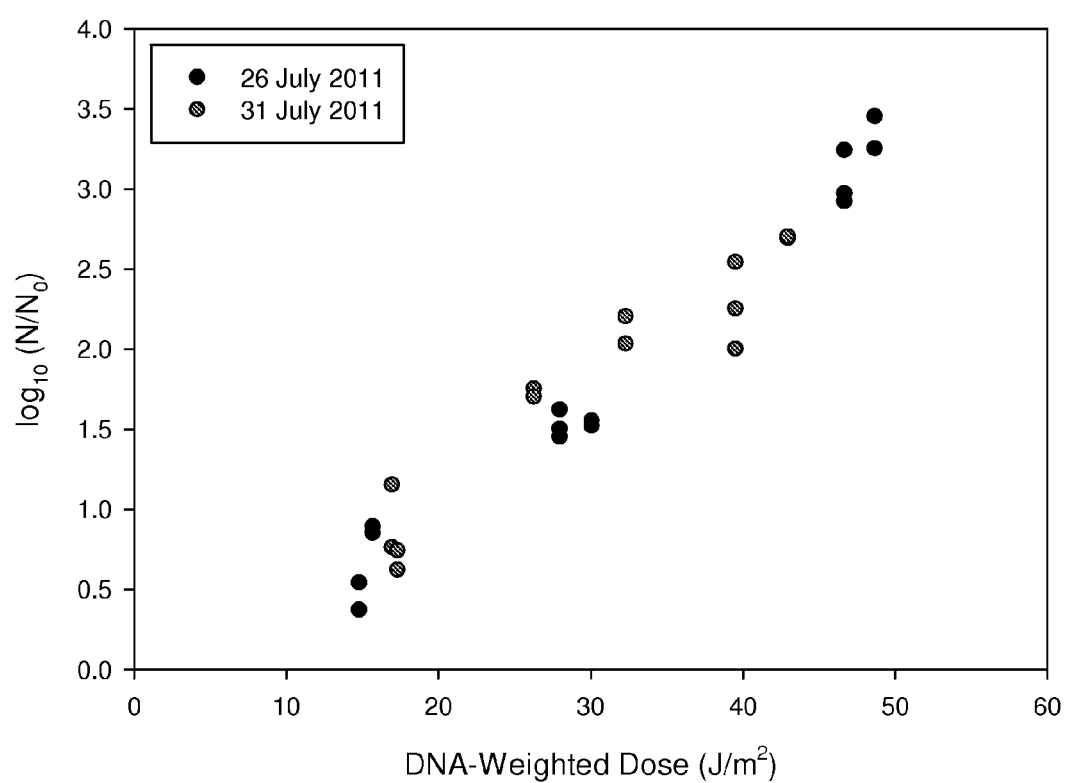
FIG. 18 is a graph illustrating E. coli inactivation as a function of DNA-weighted UV dose.

The relationship between *E. coli* inactivation and applied/weighted dose is more clearly illustrated in FIG. 18. A roughly log-linear relationship between applied UV dose and observed inactivation response emerged from this data set. This data set includes measurements of reactor performance on two separate days.

SMARTS

SMARTS was tested to compare its performance with observed irradiation data from the UV-B Monitoring Program. June 13th was chosen to test, since it was a very nearly cloudless day, minimizing cloud interference with measurements. SMARTS performance varied depending on wavelength, but in all cases it followed the observed trends closely, but consistently over-predicted intensity by 5-33%. It should also be noted that it is challenging to predict the effects of clouds on partly cloudy days with the SMARTS model. However, the model does appear to capture much of the physics that is responsible for the solar UV spectrum, and as such it appears to represent an appropriate tool for characterization of system performance at other locations.

Figure 19:
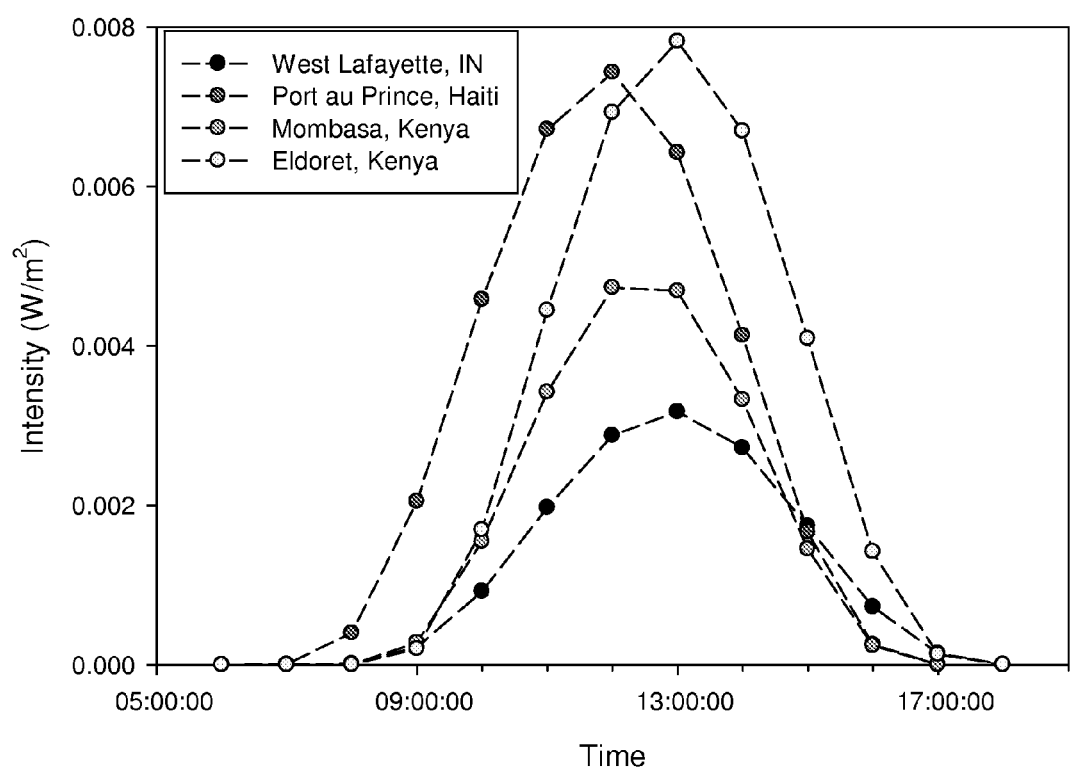
FIG. 19 is a graph illustrating SMARTS predictions of intensity as a function of time of day for 4 different locations.
Figure 20:
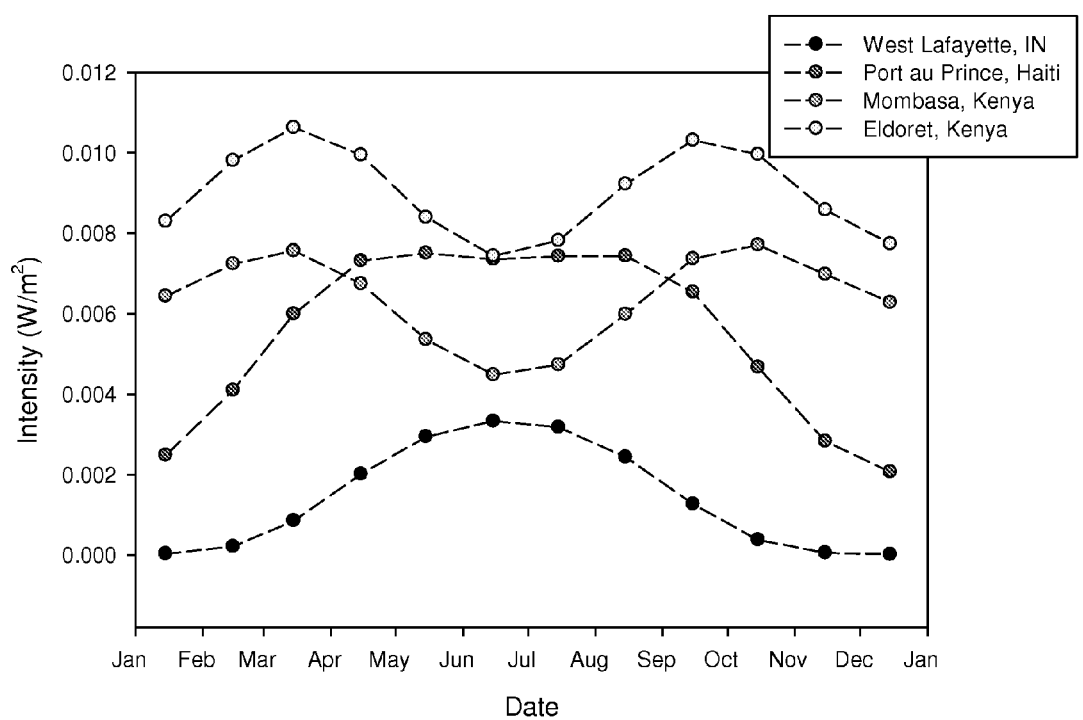
FIG. 20 is a graph illustrating SMARTS predicted intensity as a function of Julian day for 4 different locations.

FIG. 19 shows SMARTS predicted intensity values as a function of time of day for 4 locations: West Lafayette, Ind., Port au Prince, Haiti, Mombasa, Kenya, and Eldoret, Kenya. These locations were chosen because of their diversity in latitude and elevation: variables that had the largest effect on irradiation intensity data. The intensity values predicted for the three locations in developing countries were 50-150% higher than predictions (and measurements) for West Lafayette. Because higher intensities yield more rapid microbial inactivation, the results of these simulations suggest that continuous-flow solar UV disinfection efficacy is likely to improve at tropical latitudes and at higher elevations. FIG. 20 illustrates SMARTS predicted intensity values as a function of Julian day for the same 4 locations. This graph again indicates that CPC performance would improve year round in such locations.

CONCLUSIONS

There were three objectives of this study: to test alternative reflective materials for use in a CPC, to quantify disinfection efficacy and examine the effect of cloud cover, and finally to use SMARTS to estimate the feasibility of CPC disinfection systems in locations most in need of access to safe drinking water.

In the first section of experimentation, it was demonstrated that several of the metalized plastics tested have a higher reflectance performance than aluminum foil, the most traditional reflection material for CPCs. Better reflectance may yield up to 100% improvement in disinfection performance for the CPC if the metalized plastics are used instead of aluminum foil.

Disinfection efficacy was quantified for the CPC system used. 3-4 $\log_{10}$ units of disinfection were observed at peak doses of sunlight on partly cloudy days. Cloud cover had an effect on reactor performance, with improved CPC performance likely on days with fewer clouds.

Finally, The SMARTS Model predictions are representative of observed data, though they over-predict intensities at all wavelengths and cloud cover effect predictions are challenging to obtain. Despite this, the model was demonstrated to be useful for preliminary examination of reactor performance in candidate locations. The model indicates that better reactor performance year round in near equatorial regions can be expected than was observed in the experiments at West Lafayette.

While this disclosure has been described as having an exemplary design, the present disclosure may be further modified within the spirit and scope of this disclosure. This application is therefore intended to cover any variations, uses, or adaptations of the disclosure using its general principles. Further, this application is intended to cover such departures from the present disclosure as come within known or customary practice in the art to which this disclosure pertains.

What is claimed is:

1. A solar disinfection reactor comprising:
    a compound parabolic collector, wherein the collector includes an ultraviolet B (UVB) reflective coating, the UVB reflective coating is a metallized plastic film;
    a UVB transmissive receiver pipe supported in the focal area of the compound parabolic collector, wherein the UVB transmissive receiver pipe is at least 50% transmissive, and wherein the UVB transmissive receiver pipe is quartz, polystyrene, or fluoroethylenepropylene;
    at least one water storage container fluidly coupled to the UVB transmissive receiver pipe;
    a fluid flow system for delivering water under a constant flow rate from the at least one water storage container through the UVB transmissive receiver pipe; and
    wherein the collector is configured to collect solar UVB radiation and utilize the radiation to disinfect water.

2. The reactor of claim 1 wherein the UVB transmissive receiver pipe is configured to transmit solar UVB radiation.

3. The reactor of claim 1 wherein the UVB transmissive receiver pipe is made from UV radiation transparent material.

4. The reactor of claim 1 further comprising plastic tubing fluidly coupling the at least one water storage container to the UVB transmissive receiver pipe.

5. The reactor of claim 1 wherein the at least one water storage container includes an influent water storage container for holding influent water and an effluent water storage container for holding effluent water.

6. The reactor of claim 5, wherein the influent water storage container is made of glass covered with reflective material.

7. The reactor of claim 5, wherein each of the influent and effluent water storage containers are made of plastic.

8. The reactor of claim 7, wherein each of the influent and effluent water storage containers is made of high density polyethylene.

9. The reactor of claim 1, wherein the fluid flow system is a peristaltic pump.

10. The reactor of claim 1, wherein the fluid flow system is nonelectric.

* * * * *